US007844919B1

(12) United States Patent
Gupta et al.

(10) Patent No.: US 7,844,919 B1
(45) Date of Patent: *Nov. 30, 2010

(54) METHOD AND APPARATUS FOR MAINTAINING AND CONFIGURING SYSTEMS

(75) Inventors: Neeraj Gupta, Austin, TX (US); Venky Veeraraghavan, Austin, TX (US); Ajay Agarwal, Austin, TX (US)

(73) Assignee: Versata Development Group, Inc., Austin, TX (US)

( * ) Notice: Subject to any disclaimer, the term of this patent is extended or adjusted under 35 U.S.C. 154(b) by 628 days.

This patent is subject to a terminal disclaimer.

(21) Appl. No.: 10/937,160

(22) Filed: Sep. 9, 2004

Related U.S. Application Data

(63) Continuation of application No. 10/167,989, filed on Jun. 11, 2002, now abandoned, which is a continuation of application No. 10/132,590, filed on Apr. 25, 2002, now Pat. No. 6,675,294, which is a continuation of application No. 09/165,656, filed on Oct. 3, 1998, now Pat. No. 6,405,308, which is a continuation of application No. 08/707,187, filed on Sep. 3, 1996, now Pat. No. 5,825,651.

(51) Int. Cl.
*G06F 15/00* (2006.01)
*G06F 13/00* (2006.01)
(52) U.S. Cl. .......................................... 715/853; 713/1
(58) Field of Classification Search ................ 715/866, 715/810, 835, 765, 853, 744, 763; 713/1, 713/100, 853–855, 763–765, 740–748
See application file for complete search history.

(56) References Cited

U.S. PATENT DOCUMENTS

| 4,591,983 A | | 5/1986 | Bennett |
|---|---|---|---|
| 4,796,194 A | | 1/1989 | Atherton |
| 4,835,683 A | | 5/1989 | Phillips et al. |
| 5,019,961 A | | 5/1991 | Addesso et al. |
| 5,019,992 A | | 5/1991 | Brown et al. |
| 5,065,338 A | | 11/1991 | Phillips et al. |
| 5,257,387 A | | 10/1993 | Richek |
| 5,293,479 A | | 3/1994 | Quintero |
| 5,355,317 A | * | 10/1994 | Talbott et al. ................. 700/97 |
| 5,357,440 A | | 10/1994 | Talbott et al. |
| 5,515,524 A | | 5/1996 | Lynch et al. |

(Continued)

OTHER PUBLICATIONS

Priority U.S. Patent No. 5,825,651, issued Oct. 20, 1998, Office Action dated Jan. 6, 1998.

(Continued)

*Primary Examiner*—Kevin Nguyen
(74) *Attorney, Agent, or Firm*—Hamilton & Terrile, LLP; Kent B. Chambers

(57) ABSTRACT

The invention provides the ability to interactively select and configure a product among a set of related products based on availability and compatibility of features and options. It does not impose an order in the selection of products, features or options; only valid selections can be made at any time. To create an electronic representation of the product information to achieve the above goal, the invention provides a framework for defining a systems by defining the components of the system using elements contained in a parts catalog and defining relationships between the components of a system. A configuration system validates a configuration using the system definition, the current state of the configuration and user input.

13 Claims, 24 Drawing Sheets

U.S. PATENT DOCUMENTS

| | | | |
|---|---|---|---|
| 5,586,052 | A | 12/1996 | Iannuzzi et al. |
| 5,604,892 | A | 2/1997 | Nuttall |
| 5,630,025 | A | 5/1997 | Dolby et al. |
| 5,659,478 | A | 8/1997 | Pennisi et al. |
| 5,675,784 | A * | 10/1997 | Maxwell et al. ............. 707/100 |
| 5,680,530 | A | 10/1997 | Selfridge et al. |
| 5,708,798 | A | 1/1998 | Lynch et al. |
| 5,745,765 | A | 4/1998 | Paseman |
| 5,748,943 | A | 5/1998 | Kaepp et al. |
| 5,761,674 | A | 6/1998 | Ito |
| 5,781,446 | A | 7/1998 | Wu |
| 5,781,454 | A | 7/1998 | Alexander |
| 5,805,861 | A | 9/1998 | Gilbert et al. |
| 5,808,432 | A | 9/1998 | Inoue et al. |
| 5,809,282 | A | 9/1998 | Cooper et al. |
| 5,825,651 | A | 10/1998 | Gupta et al. |
| 5,856,925 | A | 1/1999 | Maeda et al. |
| 5,963,207 | A * | 10/1999 | Brewer et al. ............... 715/810 |
| 5,963,953 | A | 10/1999 | Cram et al. |
| 6,023,699 | A | 2/2000 | Knoblock et al. |
| 6,124,855 | A * | 9/2000 | Sells .......................... 715/866 |
| 6,332,040 | B1 | 12/2001 | Jones |
| 6,405,308 | B1 | 6/2002 | Gupta et al. |

OTHER PUBLICATIONS

Priority U.S. Patent No. 5,825,651, issued Oct. 20, 1998, Response filed May 11, 1998.
Priority U.S. Patent No. 6,405,308, issued Jun. 11, 2002, Preliminary Amendment filed Oct. 3, 1998.
Priority U.S. Patent No. 6,405,308, issued Jun. 11, 2002, Office Action dated Nov. 4, 1999.
Priority U.S. Patent No. 6,405,308, issued Jun. 11, 2002, Response filed Apr. 17, 2000.
Priority U.S. Patent No. 6,405,308, issued Jun. 11, 2002, Office Action dated Jun. 30, 2000.
Priority U.S. Patent No. 6,405,308, issued Jun. 11, 2002, Continuing Prosecution Application filed Oct. 2, 2000.
Priority U.S. Patent No. 6,405,308, issued Jun. 11, 2002, Office Action dated Dec. 12, 2000.
Priority U.S. Patent No. 6,405,308, issued Jun. 11, 2002, Response filed Jul. 27, 2001.
Priority U.S. Patent No. 6,675,294, issued Jan. 6, 2004, Office Action dated Oct. 25, 2002.
Priority U.S. Patent No. 6,675,294, issued Jan. 6, 2004, Response filed May 5, 2003.
Priority U.S. Patent No. 6,675,294, issued Jan. 6, 2004, Amendment After Allowance filed Jun. 27, 2003.
Priority U.S. Patent No. 6,675,294, issued Jan. 6, 2004, Response to 312 Amendment dated Nov. 24, 2003.
Priority U.S. Appl. No. 10/167,989, filed Sep. 9, 2004, Preliminary Amendment filed Jun. 11, 2002.
Priority U.S. Appl. No. 10/167,989, filed Sep. 9, 2004, Office Action dated Oct. 27, 2003.
Priority U.S. Appl. No. 10/167,989, filed Sep. 9, 2004, Response filed Apr. 27, 2004.
Priority U.S. Appl. No. 10/167,989, filed Sep. 9, 2004, Notice of Nonresponsive Amendment dated May 25, 2004.
Priority U.S. Appl. No. 10/167,989, filed Sep. 9, 2004, Response filed May 28, 2004.
Priority U.S. Appl. No. 10/167,989, filed Sep. 9, 2004, Restriction Requirement dated Sep. 1, 2004.
Priority U.S. Appl. No. 10/167,989, filed Sep. 9, 2004, Notice of Abandonment mailed Jan. 13, 2005.
Priority EP Patent Application No. 97940634.5, Office Action dated Apr. 17, 2007.
Priority AU Patent Application No. 42368/97, Office Action dated Mar. 27, 2000.
Priority AU Patent Application No. 42368/97, Response filed Jan. 17, 2001.
Priority EP Patent Application No. 97940634.5, Response filed Jan. 30, 2008.
Priority U.S. Patent No. 6,405,308, issued Jun. 11, 2002, Response filed Apr. 17, 2001.
Priority U.S. Patent No. 6,405,308, issued Jun. 11, 2002, Office Action mailed Apr. 17, 2001.
J. McDermott, Domain Knowledge and the Design Process, Annual ACM IEEE Design Automation Conference 1981.
J. McDermott, R1 The Formative Years, AI Magazine, Summer 1981.
J. McDermott, R1: A Rule-Based Configurer of Computer Systems, Artificial Intelligence, 1982.
M. Stefik, Knowledge Programming in Loops: Report on an Experimental Course, The AI Magazine, Fall 1983.
D. G. Bobrow et al., Perspectives on Artificial Intelligence Programming, Science, Feb. 28, 1986, vol. 231.
V. E. Barker et al., Expert Systems for Configuration at Digital: XCON and Beyond, Communications of the ACM, Mar. 1989, vol. 32, No. 3.
S. Mittal et al., Towards a Generic Model of Configuration Tasks, Proceedings of the Eleventh International Joint Conference on Artificial Intelligence, Aug. 20-25, 1989, vol. 2.
S. Mittal et al., A Knowledge-Level Analysis of the Cossack Expert System for Configuration Tasks, Jan. 1989.
S. Mittal et al., Dynamic Constraint Satisfaction Problems, AAAI-90 Proceedings, 1990.
S. M. Fohn et al., Configuring Computer Systems Through Constraint-Based Modeling and Interactive Constraint Satisfaction, Computers in Industry, 1995.
M. Stefik, Introduction to Knowledge Systems, 1995.
J. McDermott, XSEL: A Computer Sales Person's Assistant, Intelligent Systems: Practice and Perspective, Machine Intelligence, chapter 16, 1982.
F. Frayman et al., Cossack: A Constraints-Based Expert System for Configuration Tasks, Knowledge Based Expert Systems in Engineering: Planning and Design, 1987.
J. McDermott, R1: An Expert in the Computer Systems Domain, 1980.

* cited by examiner

METHOD AND APPARATUS FOR MAINTAINING AND CONFIGURING SYSTEMS

This application is a continuation of application Ser. No. 10/167,989, filed Jun. 11, 2002, now abandoned which is a continuation of application Ser. No. 10/132,590, filed Apr. 25, 2002, now U.S. Pat. No. 6,675,294, which is a continuation of application Ser. No. 09/165,656, filed Oct. 3, 1998, now U.S. Pat. No. 6,405,308, which is a continuation of application Ser. No. 08/707,187, filed Sep. 3, 1996, now U.S. Pat. No. 5,825,651.

BACKGROUND OF THE INVENTION

1. Field of the Invention

This invention relates to maintaining and configuring systems.

2. Background Art

A system is comprised of components. Before a system can be built the components of the system must be identified. To configure a system, a user must select the parts to include in the system. Typically, one who is knowledgeable about a system and its components defines the system. Thus, for example, an automobile salesperson assists an automobile buyer in determining the type and features of the automobile. The salesperson understands the features and options that are available to create a valid configuration. Some features and options cannot be combined. The selection of some features caused other features to be unavailable, etc. It would otherwise be difficult for the buyer to identify all of the features and options available on the automobile that can be combined to create a valid configuration.

Computer systems have been developed to assist one in configuring a system. However, these systems use a configuration language to define a system. Like a programming language, a configuration language uses a syntax that must be understood by a user who is maintaining the data (i.e., a data maintainer). To use one of these configuration systems, it is necessary for a data maintainer to understand the configuration language. This limits the number of users who are able to use the configuration systems. That is, the level of sophistication needed to communicate with the configuration system (through a configuration language) results in less sophisticated users being unable to use the system.

In addition, configuration systems impose a flow or ordering to the user operations. For example, a user is required to remove components from the system in reverse of the order in which they were chosen. Thus, a user may be forced to remove components that the user wants to keep in the configuration to remove an unwanted component. A novice user may have perform many removal operations before achieving an acceptable configuration. If the novice user is required to remove components in a preset order, the user can become frustrated or confused and abort the configuration process.

These systems are designed for a more sophisticated user that has knowledge of the system that is being configured as well as the configuration system used to configure the system. A end user such as an automobile shopper would have difficulty using these systems.

Further, to use these systems a user must be trained to understand the configuration language. Thus, a user who otherwise has knowledge of the systems that are being configured must undergo training to be able to use these configuration systems to configure systems. This leads to increased expenditures such as for training.

SUMMARY OF THE INVENTION

The invention provides the ability to interactively select and configure a product among a set of related products based on availability and compatibility of features and options. It does not impose an order in the selection of products, features or options; only valid selections can be made at any time. To create an electronic representation of the product information to achieve the above goal, the invention provides a framework for defining a product line.

A product line is defined as a set of related products. A product line has a set of products that contain parts, or components. Parts used to define a product are selected from a parts catalog. Parts in a product definition are related or classified as: included (parts that are included by default), required choices (a choice among a group of parts that must be made to achieve a valid configuration), optional (parts that can be optionally included in the configuration).

Relationships can be defined between the parts in a product definition. A relationship relates a first set of parts with a second set of parts. A set can include multiple parts. The incorporation of parts in a set can be arbitrary. That is, a multi-part set can contain parts that are otherwise unrelated. For example, a set can contain parts such as an engine, sun roof and a color. These parts seem to be unrelated, however, it is possible to combine them into a relationship set for purposes of forming a relationship using the present invention.

Preferably, the part relationships are: included, excluded, removed, and requires choice. An included part is included automatically. A part is excluded from the configuration when its inclusion would result in an invalid configuration. A part may be removed when another part is added. Thus, when a first part exists in the configuration and a second part is added, the first part is removed from the configuration. The requires choice relationship is used to allow a set of choices to be made from a group of parts. The number of parts chosen is limited to a valid bounds specification. The relations that are created between parts within a product are enforced only on that particular product. However, if some part-to-part relationships are to be enforced on all products within a product line, then the relations are generated once and enforced for all products.

A maintenance system is used to define a product. Using the maintenance system, a product can be defined using the product classifications and the part relationships. A graphical user interface (GUI) is used to allow the user to interactively generate a definition. Instead of configuration languages, GUI operations such as drag and drop and selection operations can be used to specify a definition. The notions of included, optional and required choice are easily comprehensible to a user. Further, the idea that parts have interrelationships is also easily understood. Thus, a product can be defined without having to learn a complicated configuration language.

A configuration system is used to configure a system using a definition created by the maintenance system. The configuration system ensures that the current configuration state is always valid. The user can select and unselect parts in any order. When user input is received, the configuration system validates the input based on the current state of the configuration. In addition, the configuration system identifies selections that could cause a valid configuration to become invalid. The configuration removes these selections from the set of possible selections so that the user does not make an invalid selection.

The configuration system evaluates the current state of a configuration based on the product definition, part relationships and state information. After receipt of input from a user, the configuration system evaluates relationships in both the forward and backward direction. Forward and backward evaluations can result in the addition or deletion of elements from the configuration.

The invention uses both an external and internal representation of a definition or definitions. A translation mechanism is used translate an external representation into an internal representation. The external representation uses a conceptually understandable set of relationships for defining a system and the relationships between the components of the system. The invention takes the definition created by a user and supplements and compresses the definition when necessary to create an internal representation. The internal representation is used during configuration to initialize and validate a configuration based on user input.

During configuration, the invention maintains runtime information that is stored in tables and vectors. To achieve greater processing efficiency, the systems represents elements in a configuration (e.g., product, part, and group) as a bit in a bit vector. Thus, for example, a vector has a length that is equal to the total number of elements. An element's bit can be set or reset to specify the state of the element in the current configuration. For example, a user vector can be used that specifies for each element whether the element has been selected by the user during the configuration. In addition, excluded and removed vectors identify whether an element is excluded or removed (respectively) from a configuration. Vectors can be used to identify whether an element 1) has been selected (by the user or the configuration system), 2) is selectable, and 3) notSelectable.

Tables contain element relationships. A table is used to represent the includes, excludes, removes, and requires choice relationships, for example. Each table has a left-hand side and a right-hand side that corresponds to the left-hand and right-hand sides of a relationship. In each case, the left-hand side is a bit vector that contains bits that correspond to elements. The includes, excludes and removes tables contain a bit vector in the right-hand side that represents configuration elements. The right-hand side of the requires choice table is a pointer that points to an entry in a group table. The group table entry is a bit vector that identifies the elements that are contained in the group from which a choice is to be made. The right-hand side of a requires choice table entry further includes minimum and maximum designations. Minimum and maximum values identify the minimum and maximum number of group members that are to be selected to satisfy a requires group relationship.

A bit vector implementation of relationships and internal runtime state allows for fast and efficient computation of relationship based configuration. A comparison of bits can be performed in one machine instruction in most cases.

DETAILED DESCRIPTION OF THE INVENTION

A method and apparatus for maintaining and configuring systems is described. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Figure 1:
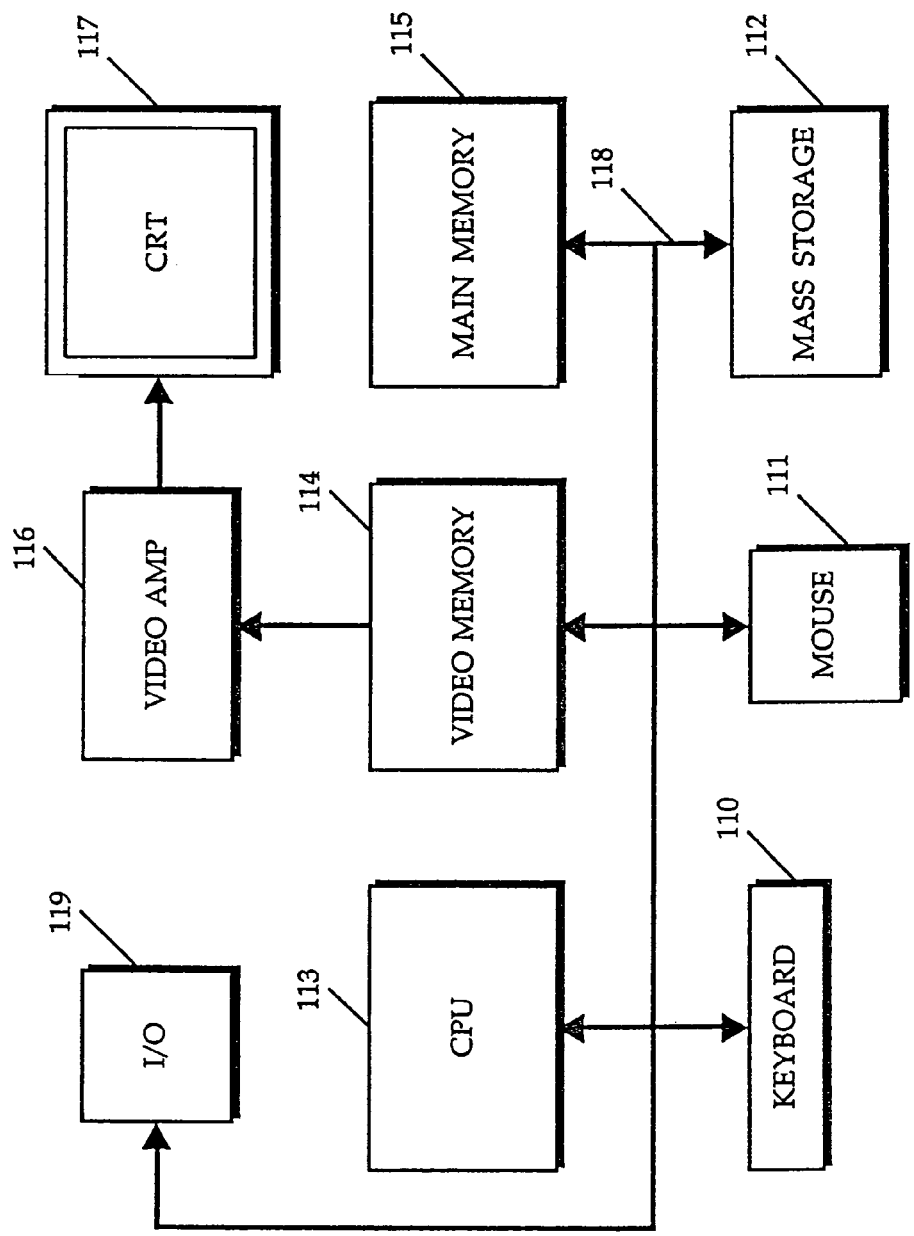
FIG. 1 provides an illustration of a computer system that can be used with the invention according to an embodiment of the invention.

The present invention can be implemented on a general purpose computer such as illustrated in FIG. 1. A keyboard 110 and mouse 111 are coupled to a bi-directional system bus 118. The keyboard and mouse are for introducing user input to the computer system and communicating that user input to CPU 113. The computer system of FIG. 1 also includes a video memory 114, main memory 115 and mass storage 112, all coupled to bi-directional system bus 118 along with keyboard 110, mouse 111 and CPU 113. The mass storage 112 may include both fixed and removable media, such as magnetic, optical or magnetic optical storage systems or any other available mass storage technology. Bus 118 may contain, for example, 32 address lines for addressing video memory 114 or main memory 115. The system bus 118 also includes, for example, a 32-bit DATA bus for transferring DATA between and among the components, such as CPU 113, main memory 115, video memory 114 and mass storage 112. Alternatively, multiplex DATA/address lines may be used instead of separate DATA and address lines.

In the preferred embodiment of this invention, the CPU 113 is a 32-bit microprocessor manufactured by Motorola, such as the 680X0 processor or a microprocessor manufactured by Intel, such as the 80X86, or Pentium processor. However, any other suitable microprocessor or microcomputer may be utilized. Main memory 115 is comprised of dynamic random access memory (DRAM). Video memory 114 is a dual-ported video random access memory. One port of the video memory 114 is coupled to video amplifier 116. The video amplifier 116 is used to drive the cathode ray tube (CRT) raster monitor 117. Video amplifier 116 is well known in the art and may be implemented by any suitable means. This circuitry converts pixel DATA stored in video memory 114 to a raster signal suitable for use by monitor 117. Monitor 117 is a type of monitor suitable for displaying graphic images.

The computer system described above is for purposes of example only. The present invention may be implemented in any type of computer system or programming or processing environment.

The invention maintains and configures systems. The invention eliminates the need for a user to learn a configuration language or write code to maintain and/or configure a system. A user interface uses various operations such as drag and drop and item selection to define a product, for example. Elements that comprise a definition (e.g., of a product) can be added or removed in any order. No order is imposed on the user. There is no requirement, for example, that the user remove parts of a product in the order in which they were added. No fixed flow or order is required to edit a given product.

A definition includes an identification of the components that comprise the definition and the interrelationships between the components. The interrelationships are conceptually easy for the user to understand. The same relationships are used to define and configure any system. An external representation that includes these relationships allows a user to view and maintain the definition. The external representation is translated into an internal representation that is designed to decrease processing time and increase response time.

In addition, during a configuration session, the invention is capable of allowing a user to select or unselect configuration items without imposing a flow on the user. There is no order imposed on the user in terms of the sequence in which items are selected for the configuration or unselected from the configuration. For example, it is not necessary to select a product before choosing options. The invention can identify the products that are still available based on the options that have already been selected. Further, a user can unselect an item (e.g., delete the item from the configuration) without regard to the order in which it was selected (e.g., added to the configuration).

Examples of systems that can be maintained or configured using the invention include automobiles, computers, time clock machines, and shoes. Terms such as part, product line, parts catalog, and product are used herein for illustration purposes. It should be apparent that this invention can be used to configure systems that are not limited to products and product lines, etc.

Figure 2:
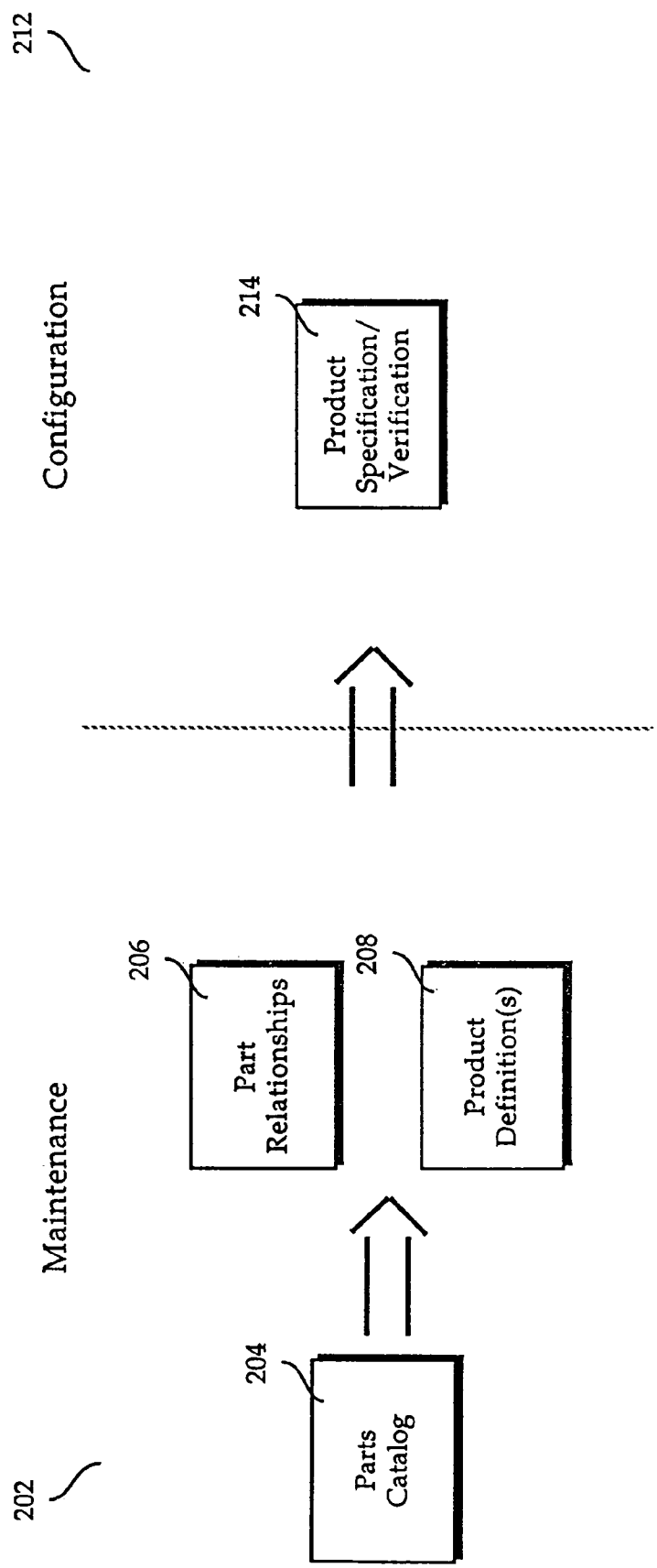
FIG. 2 provides an overview of the maintenance and configuration systems according to an embodiment of the invention.

FIG. 2 provides an overview of the maintenance and configuration systems according to an embodiment of the invention. Maintenance system 202 maintains a parts catalog 204, parts relationships 206 and product definitions 208. Maintenance system 202 uses a user interface that includes the ability to add items to parts catalog 204 and specify part relationships 206 and product definitions 208. The user interface displays a set of hierarchies that provide a conceptually easier way of viewing a definition. The invention maps the set of hierarchies (an external representation) to an internal representation.

The internal representation is used by configuration system 212 to maintain and configure systems based on user input. Configuration system 212 provides the ability to specify a product. Configuration system 212 verifies the product specification. Using configuration system 212, a user can interactively select and configure a product among a set of related products based on availability and compatibility of features and options. It does not impose an order in the selection of products, features or options. The configuration system 212 allows the user to only make valid selections. However, selections can be made in any order.

Figure 3:
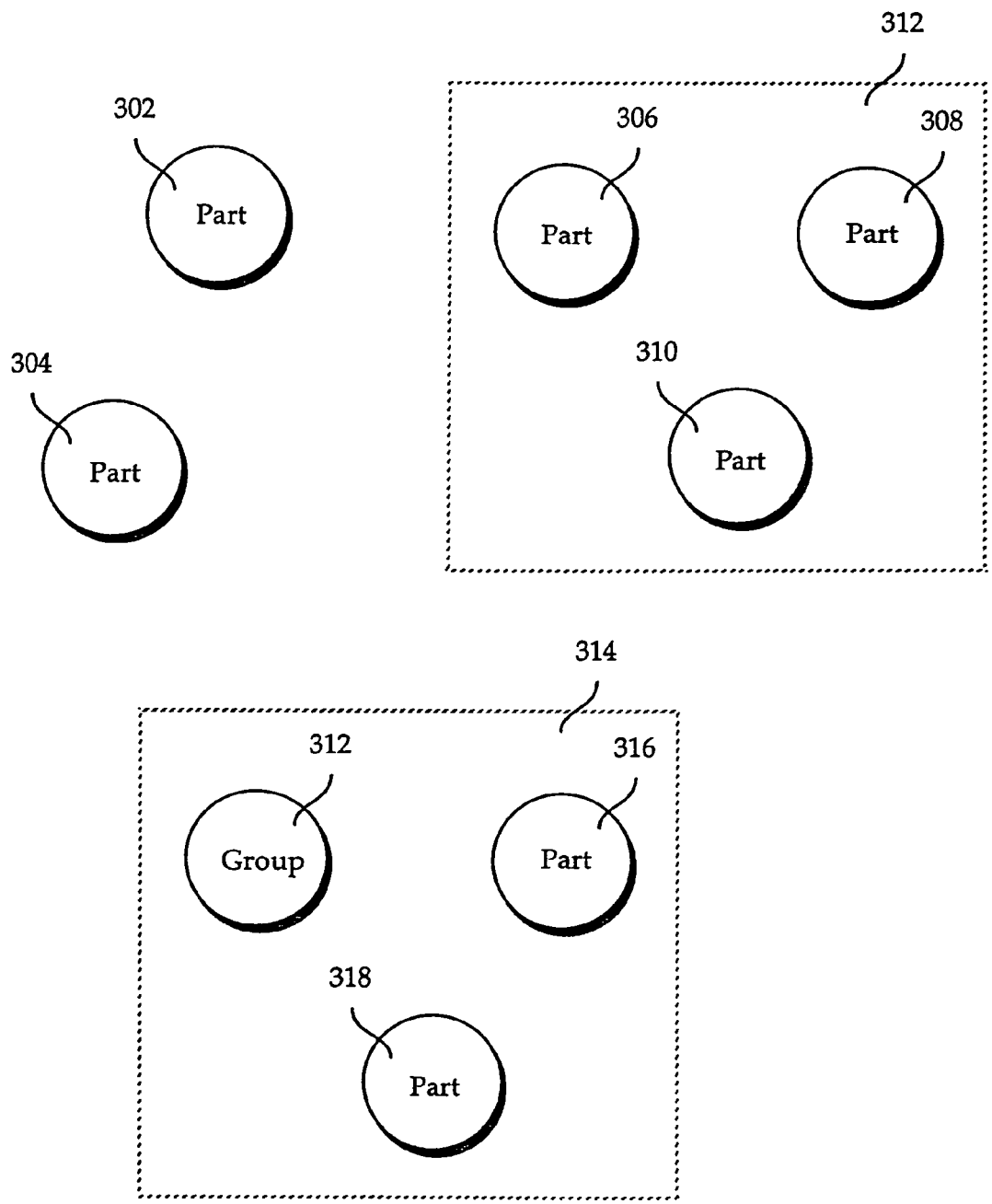
FIG. 3 illustrates examples of elements in a parts catalog according to an embodiment of the invention.

Parts catalog 204 consists of parts that are components of products. Similar parts are grouped together to form a part hierarchy. Easy maintenance of relationships is achieved by the hierarchy. For example, when a group of parts is assigned a behavior, all the members inherit that behavior automatically. FIG. 3 illustrates examples of elements in a parts catalog according to an embodiment of the invention. Referring to FIG. 3, a parts catalog (e.g., parts catalog 204) contains parts 302-310, 316, and 318. A parts catalog can also contain a group of parts such as group 312. Group 312 contains parts 306-310. A group can contain other groups. For example, group 314 contains group 312 and parts 316-318. Behavior assigned to elements of group 314 is inherited by members of group 312.

Figure 4:
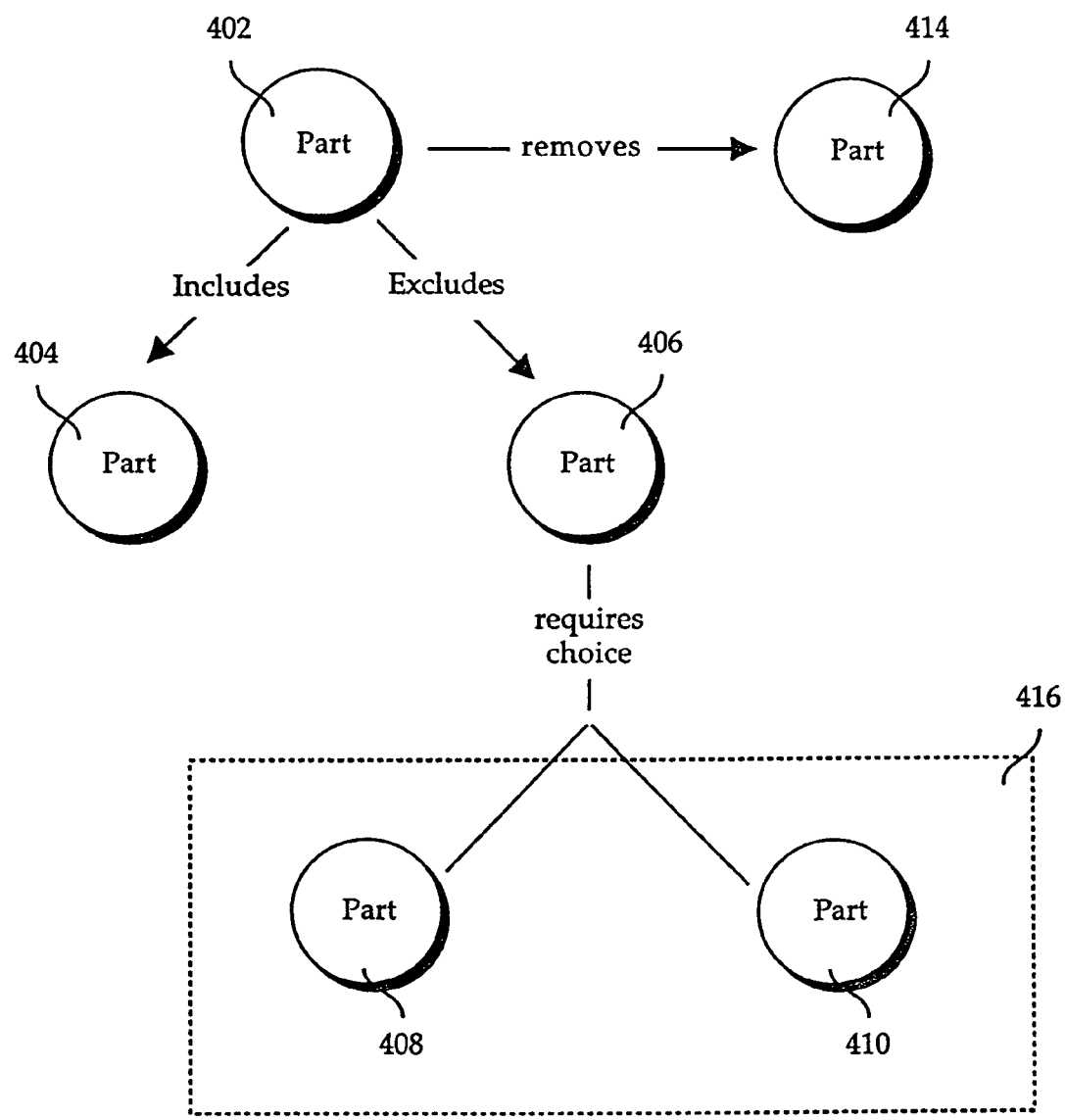
FIG. 4 illustrates relationships between parts according to an embodiment of the invention.

Part-to-part relationships can be created between parts within a product. Relationships are defined between a first set of parts and a second set of parts. During configuration, when all of the members of the first set of parts are selected, the relationship between the two sets is enforced on the parts in the second set. In the preferred embodiment, there are four kinds of relationships between parts: requires choice, includes, can't work with (or excluded), and removes. FIG. 4 illustrates relationships between parts according to an embodiment of the invention.

Part 402 includes part 404. The includes relation causes a set of parts in a second set (e.g., part 404) to be included in the configuration when a first set of parts (e.g., part 402) is selected. For example, a luxury package includes a CD player; when the luxury package is selected, a CD player is included in the configuration. The can't work with (or excluded) relation ensures that a set of parts from a second set are never in the same configuration as parts in the first set. For example, part 402 (e.g., sun roof) can't work with part 406 (e.g., a roof-top antenna). When part 402 is selected, part 406 cannot be selected. Part 406 is excluded such that it cannot be selected.

When part 402 is selected, part 414 is removed from the configuration. The removes relation causes items that are included in a second set of to be removed from the configuration when the left side is selected. For example, when a high end stereo is selected the standard stereo is removed from the configuration.

The requires choice relation recognizes that a choice (between a minimum and maximum number) has to be made between a second set of parts (or members of a group) to ensure a valid configuration when the parts in a first set are selected. Part 406 (e.g., climate control feature) requires that a choice be made among parts 408-410 (e.g., 1 zone A/C or 2 zone A/C). A requires choice relationship requires that a number of items be selected based on minimum and maximum values from the right-hand side of the relationship to satisfy the relationship.

Parts 408 and 410 can be combined to form group 416. Group 416 can be defined by the user. If the user does not define group 416, the invention preferably creates group 416 to contain parts 408 and 410. Thus, when two or more parts are defined on the right-hand side of a requires choice relationship, the invention preferably creates a group that contains these parts. The requires choice then becomes a requires choice on the group (e.g., group 416).

Parts are used to illustrate relationships in FIG. 4. However, a relationship can contain groups. To illustrate, a group of parts can be substituted wherever a part is used in the illustration. Thus, for example, parts 402, 404, 406, 408, 410, and 414 can each be replaced by a group of parts. Thus, for example, if parts 402 and 404 are replaced by groups (e.g., groups 402 and 404, respectively), when the members of group 402 are selected, the members in group 406 are included in the configuration. To further illustrate, part 408 can be replaced by group 408. In that instance, group 408 is a member of group 416. A hierarchy of groups (e.g., group 408 contained within group 416) can be used in a relationship.

Parts can be combined to form an arbitrary grouping. Thus, it is not necessary to combine parts in a group based on a logical or intuitive relationship between the parts in the group. For example, a group can contain an engine, a color, and a sun roof.

The relations that are created between parts within a product are enforced only on that particular product. However, if some part-to-part relationships are to be enforced on all products within a product line, then the relations are created once and are enforced for all products. These relationships are referred to as global relationships.

Figure 5:
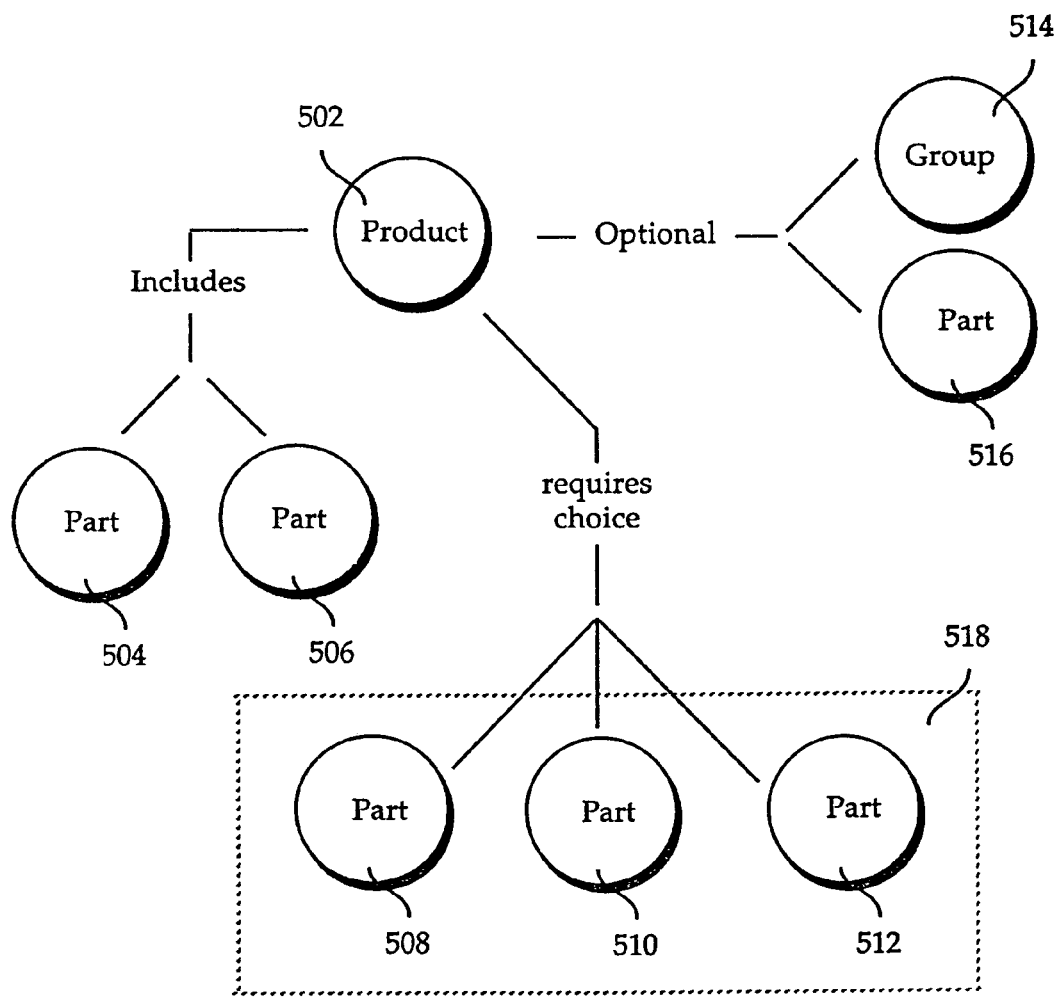
FIG. 5 provides an example of product classifications according to an embodiment of the invention.

A product includes zero or more elements of parts catalog 204. Product definition 208 (see FIG. 2) is generate by populating it with its component parts. Product definition 208 is generated by population of a product with its component parts. The parts within a product are classified as one of three different types: included parts, required choices, or optional parts. A part that is not classified as one of these types is assumed to be unavailable in that product. FIG. 5 provides an example of product classifications according to an embodiment of the invention.

An included part is a part that is included in a product by default. For example, parts 504 and 506 are automatically included in product 502. for example, when a configuration user chooses the product definition product 502, the parts 504 and 506 are automatically included in the configuration. A required choices classification specifies that a choice among a group of parts has to be made to create a valid product configuration. For example, product 502 (e.g., automobile) can include a color group 518 containing red (part 508), green (part 510) and blue (part 512) that is a required choice. In configuring a product, the user must choose a color in this group to create a valid product configuration. Parts 514 and 516 are optional parts. An optional part is not required for a valid configuration.

A product line is defined as a set of related products. The invention provides the framework for defining a product line. To define a product line: all parts (components) in the product line are entered into parts catalog 204. An instance in products definition 208 is created that identifies parts from parts catalog 204 that are assigned to a product. Part relationships 206 can also be defined for the product.

Maintenance System

Figure 6:
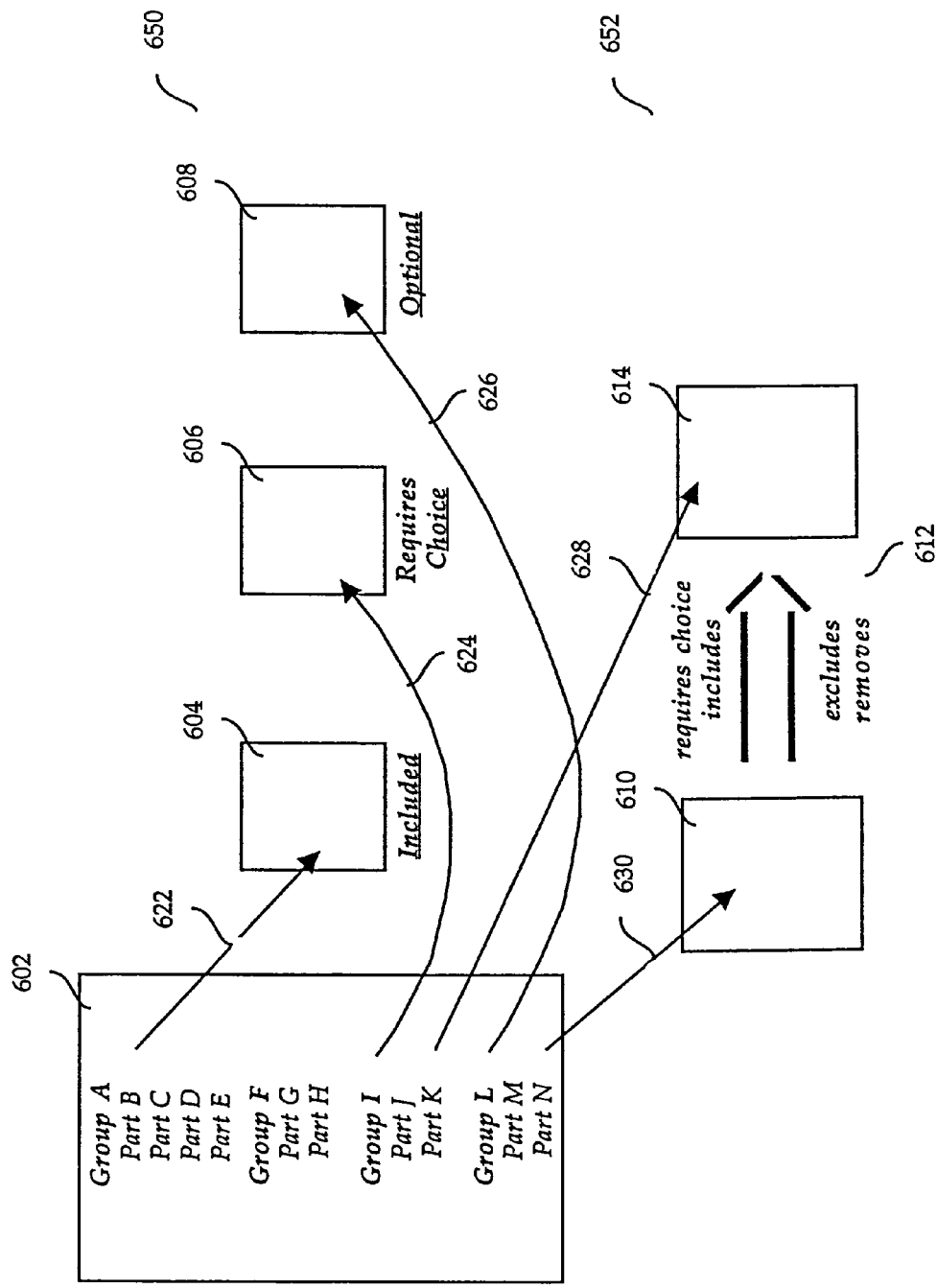
FIG. 6 provides an example of a GUI screen used in maintenance system 202 according to an embodiment of the present invention.

Parts catalog 204, part relationships 206, and product definition 208 are created and maintained using maintenance system 202. While any method can be used for creation and maintenance, a graphical user interface (GUI) is preferably used. A text editor could also be used for data entry, for example. FIG. 6 provides an example of a GUI screen used in maintenance system 202 according to an embodiment of the present invention. One who uses the GUI screen (a maintainer) can define a product (e.g., an automobile). A product definition is used by a configuration user to configure a system defined in maintenance system 202. Parts catalog 204 uses a database or other type of storage and retrieval capability, for example, to store information about its parts (e.g., part number, description, price, etc.).

The GUI screen of FIG. 6 is divided into a product definition section 650 and a part relationship definition section 652. Pane 602 displays elements from parts catalog 204. Panes 604, 606, 608 are used to define a product. Panes 604, 606, and 608 represent classifications or product relationships. Panes 610 and 614 and relationship 612 are used to define part relationships.

A user can drag elements from pane 602 to panes 604-608 to define a product. For example, to include Part B in the product definition, Part B is dragged from pane 602 to pane 604. Alternatively, to drag parts B, C, D, and E, group A can be dragged from pane 602 to pane 604. Group A and its component parts (parts B, C, D, and E) are thereby included in the product definition. Similarly, a user can specify that a configuration user must choose a part from a group, e.g., Group I, by dragging one or more parts or a group into pane 606. An optional part or group can be identified by dragging an element, e.g., Group L, into pane 608. If an element from pane 602 is not moved to one of panes 604-608 it is assumed that the maintainer wants to exclude that element from the product that is being defined. The product-level relationships or classifications (or types) illustrated in FIG. 5 can be defined using panes 604-608.

A subset of the product-level relationships map to a subset of the part relationships. For example, the include and requires choice product-level relationships map to the same named part relationships (as defined in FIG. 4 and shown in relationships 612). Minimum and maximum values set for a requires choice product-level relationship map to the minimum and maximum values of a requires choice part relationship. Elements that are not dragged into one of panes 604, 606. or 608 are considered to be excluded.

In addition to defining the elements (and their types) that comprise the product, the maintainer can specify relationships between parts of the product. Panes 610 and 614 and relationship 612 are used to define relationships between parts. The maintainer can drag an element (or elements) from pane 602 into pane 610. For example, the user can drag Part N from pane 602 into pane 610. The element(s) dragged into pane 610 are referred to as the left-hand side of the relationship. The element (or elements) from pane 602 that is related to the left-hand element(s) is dragged into pane 614. The element(s) dragged into pane 614 are referred to as the right-hand side of the relationship. For example, the user can drag Part K from pane 602 to pane 614.

To identify the type of relationship that exists between the left-hand side and right-hand side elements, the maintainer chooses one of the four part-to-part relationships from relationship 612. For example, if the maintainer chooses the includes relationship, the right-hand side elements are included in the product when a configuration user selects the left-hand side element(s). Thus, for example, Part N includes Part K. When Part N is chosen by a configuration user, Part K is automatically included in the configuration.

When the maintainer completes the product definition using the GUI screen, the product definition is saved (e.g., in parts definition 208). The product definition can then be used by a configuration user in configuration system 212.

External and Internal Representations

The GUI screen of FIG. 6 illustrates a view of a product as seen by a user (e.g., maintainer and configuration user). A view of the product that is seen by a user is referred to as the external representation. A user sees a product or product definition from a conceptual level that is easy to understand.

The user does not need to express a definition or configuration using a language that has a syntax that is foreign to the user. A GUI having graphical selections and operations is preferably used to allow the user to see the external representation. The external representation uses terminology that is familiar or intuitive to the maintainer. For example, an include product relationship defines elements that can be included in a product.

Figure 7:
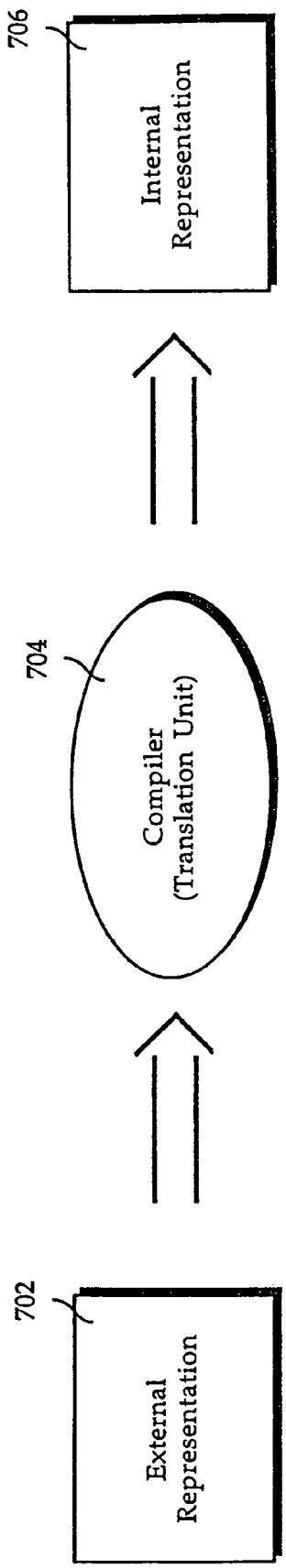
FIG. 7 provides an block diagram illustrating the conversion process according to one embodiment of the invention.

An external representation seen by the user is translated into an internal representation that can be used by the invention to process user input. FIG. 7 provides a block diagram illustrating the conversion process according to one embodiment of the invention. Compiler 704 is used to perform the conversion. Compiler 704 generates internal representation 706 from external representation 702.

External representation 702 is the representation of a product definition that is created using the maintenance system of the invention. External representation 702 provides a graphical representation of a system definition, its components and their interrelationships. FIG. 6 can be used to display external representation 702. External representation 702 can include a multi-level hierarchy of parts that help to define the product at a conceptual level. The hierarchies are not required to drive a configuration session, however. Therefore, compiler 704 flattens out the hierarchies. A set of relationships is generated using external representation 702 during a translation process.

Figure 8A:
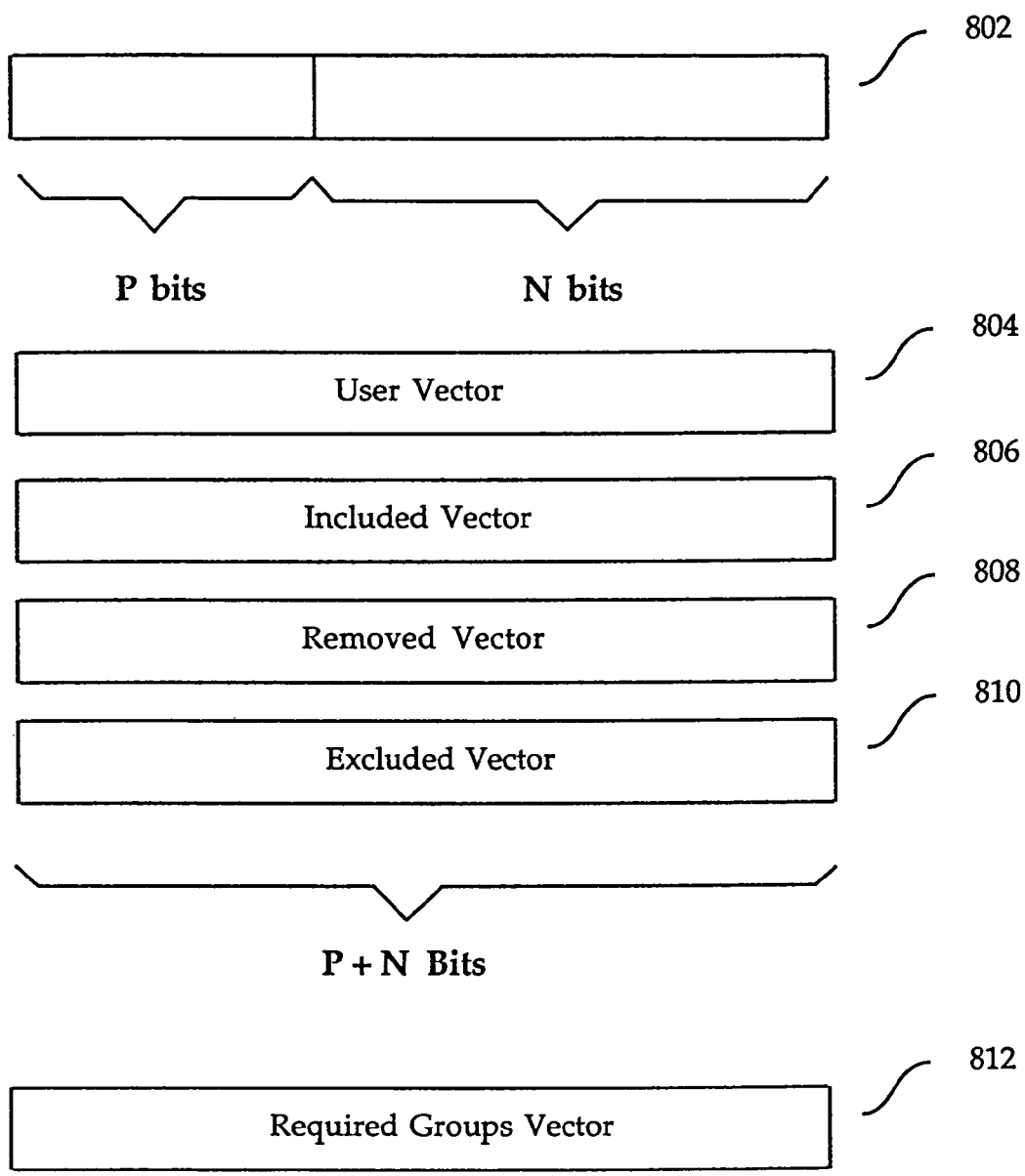
FIGS. 8A-8B illustrate components of internal representation 706 according to an embodiment of the invention.
Figure 8B:
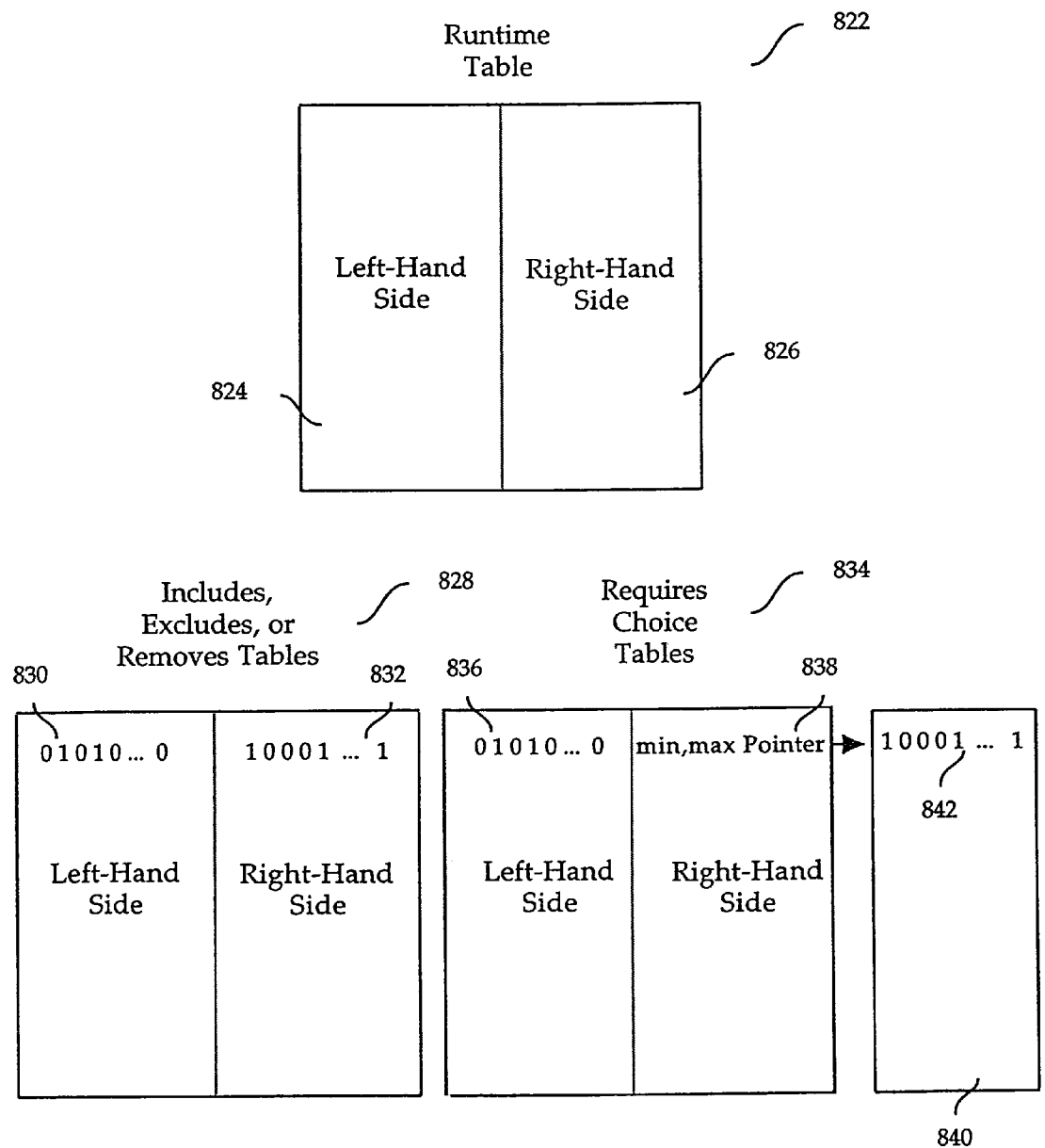

The set of relationships generated for a system definition by compiler 704 comprise internal representation 706. Internal representation 706 is generated from external representation 702 and can be used to control a configuration session. In addition to internal representation 706, a configuration state is used during the configuration session. FIGS. 8A-8B illustrate components of internal representation 706 and the configuration state according to an embodiment of the invention.

Referring to FIG. 8A, vector 802 provides an example of a vector used to store state information. Vector 802 is comprised of bits. A set of p bits is used to represent the products that are known to maintenance system 202 and configuration system 212. Each bit of the P bits corresponds to a product. A set of N bits is used to represent the parts. Each bit in the N-bit set corresponds to a part in parts catalog 204, for example. Vector 802 is therefore P+N bits in length.

Vectors 804-810 provides implementation examples of vector 802. Vectors 804-810 are maintained by configuration system 212 in a configuration session. Vector 804 is a user vector that contains the set of elements that are selected by the user. Vector 804 is referred to as the user vector, or uVec. The set of elements that are included in the configuration by the configuration system (e.g., an item that is automatically included when the user selects the left-hand in an includes relationship) is contained in included vector 806, or iVec. Removed vector 808, or rVec, contains the elements that are removed from the configuration by configuration system 212. Elements excluded from the configuration by configuration system 212 are identified in excluded vector 810, or xVec.

Each element that can be used to configure a system has a bit in these vectors. When an element is included, excluded, removed (or deleted), or selected, the corresponding bit in the appropriate vector (iVec, xVec, rVec, or uVec) is set. The use of vectors to represent elements results in increased efficiency in processing. Bit-wise operations can then be used during processing. For example, it is possible to determine whether a group of elements have been selected by the user by performing a bit comparison using the uVec. The increased efficiency results in optimal response times that are necessary for an interactive system such as is preferred for configuration system 212. The bit vector implementation used by the invention allows for fast and efficient computation of runtime algorithms. A bit vector implementation of relationships and internal runtime state allows for fast and efficient computation of relationship based configuration.

Another vector that contains state information is required groups vector 812, or rgvec. The rgvec contains a bit for each of the required groups specified for a product. As previously discussed, the maintainer can include a required group in a product definition by dragging a group from pane 602 to pane 606, for example (see FIG. 6). The number of bits in rgVec can differ from the number of bits in vectors 802-810. The number of bits contained in rgvec corresponds to the total number of required groups defined for a product. Each bit in rgVec is set to indicate that it has not yet been satisfied. It is unset (set to zero) when a required group has been satisfied. Thus, when a user attempts to accept a configuration, configuration system 212 can determine whether all of the required choices have been satisfied.

In addition to these vectors, additional vectors are used to determine a current state. The current state is defined by three types of state information that track the state of parts in the configuration. The current state is visible to the user. The three state types are: selected, selectable, and notSelectable. The selected state identifies all of the parts that are currently included in the configuration. The selectable state identifies the parts that are not in the configuration but that can be selected by the user for the configuration. The notSelectable state identifies the parts that are not in the configuration and cannot be selected by the user. Configuration system 212 ensures that only parts that can form a valid configuration are selectable; those that cannot are notSelectable.

The uVec, iVec, xVec, and rVec vectors can be used to generate the three visible states. The states are dynamic and can change based on user input. The following provides definitions using the formulae that can be used to generate the three visible states (+ is union and − is difference):

Selected=($u$Vec+$i$Vec)−$r$Vec

NotSelectable=$x$Vec+$r$Vec

Selectable=[AllItems]−Selected−NotSelectable

Computation of the visible state using C++, for example, can be accomplished using the following C++ code (the syntax assumes appropriate bit-wise operator overloads for the given operations):

SelectedVec=($u$Vec|$i$Vec)&~$r$Vec

NotSelectableVec=$x$Vec|$r$Vec

SelectableVec=~(SelectedVec|NotSelectableVec)

The selected state is the union of the elements selected by the user or automatically included in the configuration minus the elements removed by configuration system 212. The not-Seletable state is the union of the elements that are excluded or removed. The selectable state is the set of all elements minus the elements already selected and the elements that cannot be selected. The selected, selectable, and notSelectable states can be generated from these four vectors when needed. They can be stored as vectors that have the structure of vector 802.

Runtime tables are preferably used to store internal representation 706 for a configuration session. FIG. 8B provides an example of runtime tables. Runtime table 822 provides an example of a runtime table. Runtime table 822 can be used to store relationship information. Runtime table 822 has left-hand side 824 and right-hand side 826. Left-hand side 824 contains the left-hand side of a relationship (e.g., includes, removes, can't work with or excludes). The right-hand side of a relationship is stored in right-hand side 826.

Table 828 provides an example of runtime table 822. Table 828 can be an includes, excludes, or removes table, for example. Left-hand side 830 contains a bit vector (i.e., "01010 . . . 0"). Right-hand side 832 contains a bit vector (i.e., "10001 . . . 1"). Each bit in bit vectors 830 and 832 corresponds to an element in parts catalog 204 or a product. For example, if the product definition is for an automobile, each "1" bit in bit vector "01010 . . . 0" corresponds to a part in parts catalog 204 that is contained in an automobile's product definition. Zero bits indicate that the part is not included in the product definition. With reference to bit vectors, parts can be identified by the position of their corresponding bit in the bit vector. For example, the part (that corresponds with the "1" bit in the bit vector "0010" is part number three.

If table 830 is an instance of an includes table, when parts designated on left-hand side 830 (e.g., part numbers two and four) are selected, configuration system 212 includes the parts designed in right-hand side 832 (e.g., part numbers one and five). Similarly, if table 830 is excludes (or can't work with) table, parts one and five are excluded from the selectable parts when parts two and four are selected. Parts one and five are removed from the configuration when parts two and four are selected.

Like the includes, excludes, and removes tables, the requires choice table contains a left-hand side and a right-hand side. In one embodiment, both sides of the requires choice table contains a bit vector that corresponds to elements in parts catalog 204. Thus, for example, when selected, the part(s) identified on left-hand side 836 require a choice of a minimum and maximum number of parts from the parts contained on the right-hand side 838.

Table 822 can be altered to optimize the storage and use of information for a required choice table. Table 834 provides an example of an altered table 822. Preferably, however, right-hand side 838 contains a pointer to a group table (e.g., group table 840) that contains a bit vector (bit vector 842) that identifies the parts contained in the group. An advantage that the latter (altered table 822) format has over the former (unaltered table 822) is that it is only necessary to define the members of a group once. Each product definition that includes the group can point to the entry in the group table that contains the group definition.

One relationship table can be used for all products per relationship type. That is, a single includes table is used for includes relationships for all of the products. Alternatively, a table can be partitioned for each product. That is, the relationships associated with a product are segregated. For example, there would be a includes relationship table for each product. This has the advantage of only having to process only those relationships that exist for the chosen product. When a product is unselected or not selectable, there is no need to process the tables associated with that product. The latter alternative is preferable because it lessens processing requirements.

Configuration System

Using configuration system 212, a configuration user can configure a system given a product definition (e.g., product definition 208) and part relationships associated with the product definition. Configuration system 212 accepts a configuration user's input and processes it to update the configuration based on the user's input or notify the user that the input is invalid given the current state of the configuration and the system definition. Configuration system 212 ensures that the current configuration state (determined by the product definition and order-independent user selection) is always valid.

User Selection

Figure 9:
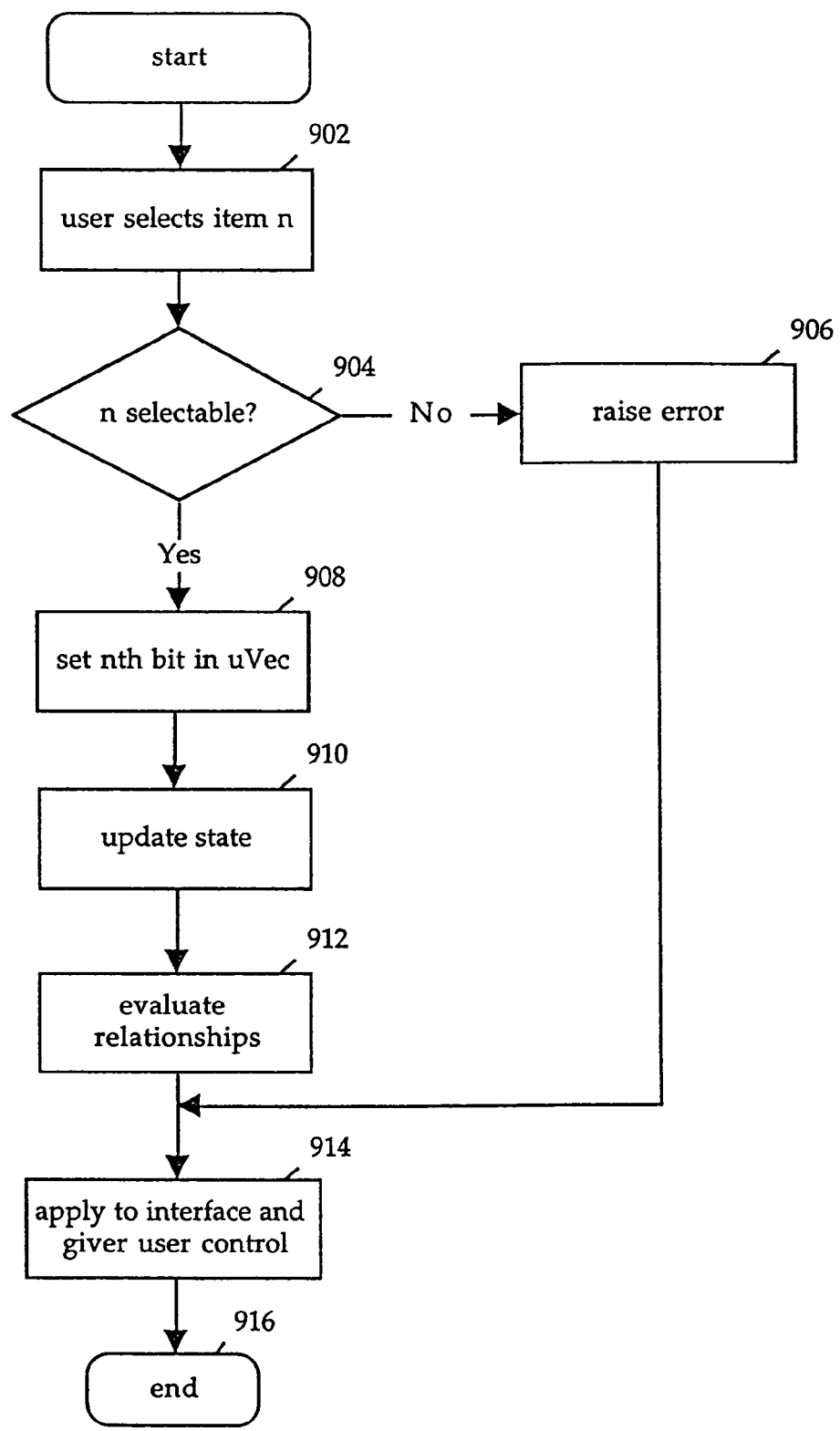
FIG. 9 provides a process flow for processing a user selection according to an embodiment of the invention.

When user input is received by configuration system 212, it is processed based on the current configuration state, the product definition and the parts relationships. FIG. 9 provides a process flow for processing a user selection according to an embodiment of the invention.

At step 902, the user selects item n (e.g., part) preferably using a GUI screen. At step 904 (i.e., "n selectable?"), a determination is made whether the item is selectable. Thus, for example, configuration system 212 determines whether the nth bit in the selectable state information is set. If it is not, configuration system 212 determines that the item is not selectable by the user and raises an error at step 922. Processing then continues at step 914 to update the interface (if necessary) and return control of the GUI screen to the user. Processing of the current input ends at step 916.

If, however, it is determined at step 904 that the item selected by the user is selectable, processing continues at step 908 to set the nth bit in uVec 804. At step 910, the visible state information is updated as discussed above. At step 912, the relationships associated with the product definition are evaluated as discussed below. Processing continues at step 914 to update the interface (if necessary) and return control of the GUI screen to the user. Processing of the current input ends at step 916.

Relationship Evaluation

Relationships associated with items contained in the product definition are evaluated when user input is received. Configuration system 212 determines what relationships are active and inactive given the user input (at step 912, for example). A relationship is active when all the items on the left-hand side of the relationship are selected. A relationship is inactive until all of the parts on the left-hand side of the relationship are selected.

As previously discussed, relationship tables can be used to store the left-hand and right-hand sides of a relationship. That is, a relationship can be defined as a pair of bit vectors, the lhsVec (left-hand side) and the rhsVec (right-hand side). A relationship is made active if the following expression is true:

$$SelectedVec \& lhsVec == lhsVec$$

When a relationship is made active, updating the appropriate state vector (iVec, xVec, or rVec) becomes:

$$stateVec |= rhsVec$$

An active relationship causes the configuration state to be updated. When an include relationship is activated, for example, parts identified on the right-hand side of the include relationship are added to the configuration, if they are not already included. The state is changed by modifying iVec 806. A change in iVec 806 can change other state information such as the selected and selectable state information. Parts that are included as a result of the activation of the includes relation can result in a ripple effect that causes other relationships to become activated. Thus, additional state changes can occur as a result of the include relationship's activation.

To further illustrate, when a requires choice relation becomes active, configuration system 212 includes and excludes items of the given group where applicable: if exactly max (maximum number of) items of the given group are selected, the engine excludes all other items in the group (added into xVec); otherwise, if less than min (minimum number of items of the group are selected and only one valid selection path exists to make exactly min items selected, the engine includes (into iVec) the items that are needed (note that these must have been selectable items).

Configuration system 212 also ensures that no relationship that will put the configuration into an invalid state can become active (for example: if b is Selected then the relationship [a] can't work with [b] should not be active). If a relationship will make a configuration invalid, it is made notActivateable. For example, a relation should be made notActivateable, if:

1) an includes relationship has excluded (xVEc) parts on the right-hand side;

2) a excludes (can't work with) relationship has Selected parts on the right-hand side;

3) a removes relation has user-selected (uVec) parts on the right side; or 4) a requires choice relation has a group for which between [min, max] parts can't be Selected.

In addition to the relationships created by a maintainer, there are some relationships that are dynamically created or deduced at runtime. If a relation becomes notActivateable and all but one item from the left-hand side is Selected, then the unSelected item is excluded by the engine. This ensures that the relation will not become active.

Configuration system 212 evaluates each relationship forward and backward. In a forward evaluation, the left-hand side of a relationship is examined to determine whether all of its parts are included in the configuration. If they are, the relationship is considered to be active. An active relationship causes the right-hand side of the relationship to then be evaluated. The evaluation is dependent on the type of relationship. An includes relationship causes the parts specified in the right-hand side to be included in the configuration specification. A removes relationship causes the right-hand side parts to be removed from the configuration. An excludes relationship cause the left-hand side parts to become notSelectable. A requires choice relationship recognizes that a choice has to be made by the user between the set of right-hand parts.

In a backward evaluation, configuration system 212 determines whether a relationship if activated would result in an invalid state. If so, configuration system 212 takes steps to ensure that the relationship cannot be activated. Instead of evaluating the left-hand side first as in the case of a forward evaluation, a backward evaluation evaluates the relationship by first examining the right-hand side. If a relationship fails the backward evaluation (i.e., its activation would result in an invalid state), configuration engine 212 takes steps to ensure that the relationship cannot become active. For example, if a relationship states that part A can't work with part B and part B is selected, configuration system 212 excludes part A. This ensures that part A cannot be selected and the excludes relationship cannot become active. Otherwise, a user can select part A which would result in an invalid configuration state.

The invention performs a relaxation over the set of relationships. A relaxation is an iterative process that is repeated until a state that has been defined no longer changes. That is, relationship evaluation is completed when none of iVec, xVec, or rVec are modified during an iteration. The invention ensures that the relaxation process terminates by only adding bits to the state. That is, because iVec, xVec, and rVec all grow through the iteration, the relaxation process is guaranteed to terminate.

Figure 10:
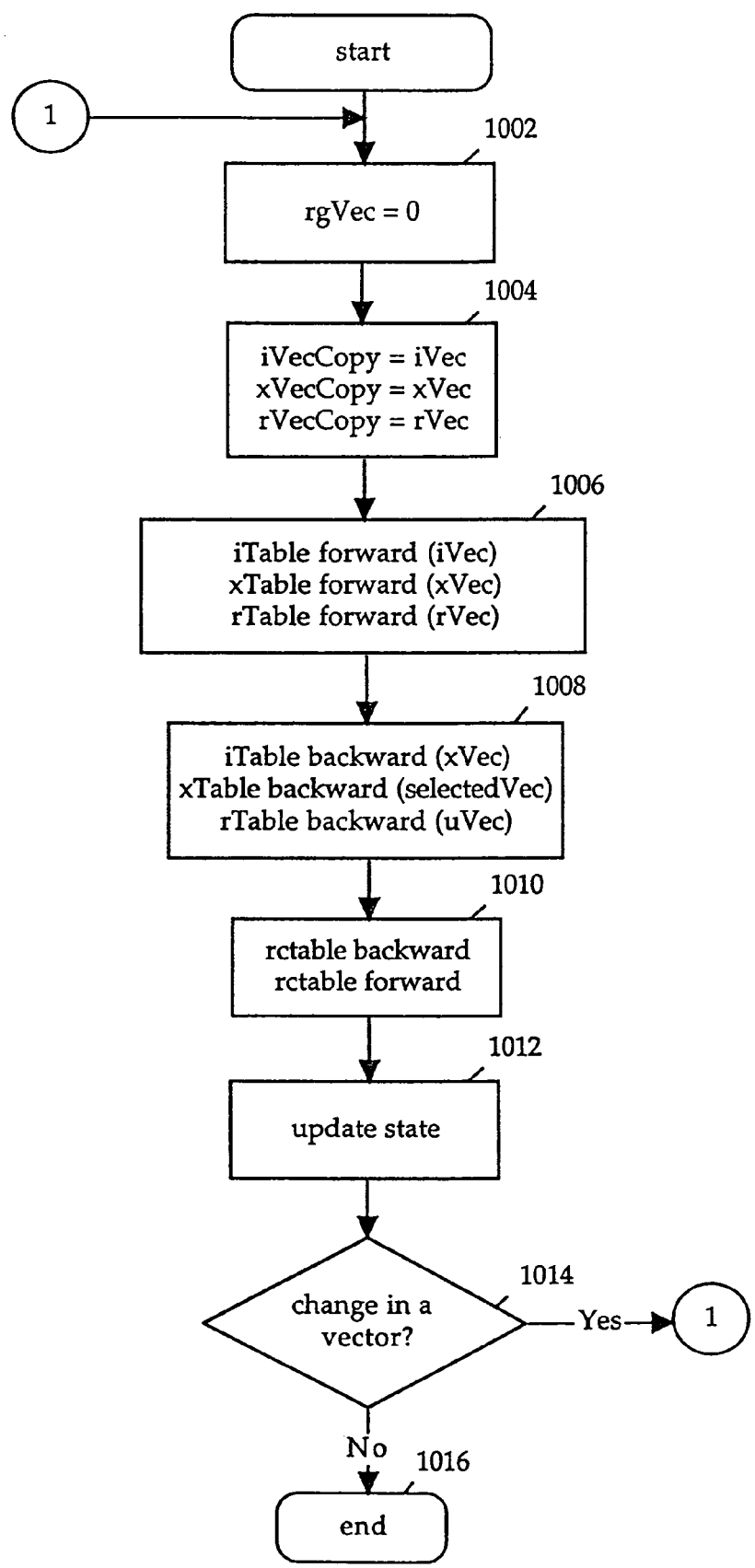
FIG. 10 provides an example of a relationship evaluation process flow according to an embodiment of the invention.

FIG. 10 provides an example of a relationship evaluation process flow according to an embodiment of the invention. At step 1002, rgVec is initialized to zero. During the relationship evaluation, rgVec is regenerated. At step 1004, copies of iVec, xVec, and rVec are made. The copies are used to determine whether relaxation is finished. At step 1006, the includes table associated with the product definition is evaluated in the forward direction. Similarly, forward evaluation is performed on the excluded and removed tables. The forward evaluation performs an "or" operation with the selectedVec and a specified configuration state vector (e.g., a forward evaluation of the includes table performs an "or" operation with the selectedVec and the iVec) when the left-hand side of the relationship is true. For example, when the items that correspond with the "1" bits in left-hand side 830 are all selected (i.e., in the selected vector), right-hand side 832 is "or'ed" with the iVec to add the items that correspond with the "1" bits in right-hand side 832 to the configuration where a forward evaluation of an includes relationship is being performed.

At step 1008, a backward evaluation is performed on the relationships contained in the includes, excludes, and removed tables. In a backward evaluation of an include relationship, the xVec is examined to determine whether any right-hand side items of an include relationship are excluded. If so, selection of all of the left-hand side items would result in an invalid configuration state. Therefore, the last remaining left-hand side item (if only one remains) is excluded to cause the relationship to never become active. Thus, the relationship is rendered notActivateable.

Backward evaluation of an excluded relationship examines the selectedVec. If a left-hand side item (an item that is supposed to be excluded when the relationship becomes active) is selected, selection of all of the left-hand side items would result in an invalid configuration state. To ensure against an invalid configuration state, a left-hand side item is excluded so that the relationship never becomes active (the relationship is rendered notActivateable).

In the preferred embodiment, configuration system 212 cannot delete, or remove, a user-selected item. The uVec is examined in a backward evaluation of a removes relationship. If a right-hand side item is a user selected item, the selection of all of the left-hand side items would result in an invalid configuration state. To ensure against an invalid configuration state, a left-hand side item is excluded so that the relationship becomes notActivateable.

At step 1010, backward and forward evaluation is performed on the requires choice table 834. In the backward evaluation, a determination is made whether a requires choice relationship should become notActivateable. For example, if it is impossible to satisfy a group, then a left-hand side item should be excluded to cause the relationship to become notActivateable.

In the forward evaluation, rgvec is set and items are included or excluded where appropriate. For example, if the right-hand side items are within range (within min and max values for the required choice relationship), then the remaining right-hand side items are excluded. If the only way to make a requires choice valid is to select the items remaining on the right-hand side item, configuration system 212 includes these items. In addition, a requires choice relationship is evaluated to determine whether the right-hand side items selected are within a valid range. If not, the corresponding bit in the rgvec is set. If so, the corresponding bit in the rgVec is zeroed.

The selected, selectable, and notSelectable states are updated at step 1012. At step 1014 (i.e., "change in a vector?"), a determination is made whether any of iVec, xVec, or rVec were modified during the current iteration of the relaxation process. If not, a stable state has been achieved, and processing ends at step 1016. If so, additional iterations are needed to complete the relaxation process. Processing therefore continues at step 1002 to initiate a new iteration.

In evaluating relationships, it is not necessary to evaluate a relationship in either the forward or backward direction once it has become active. Also, when a relationship is notActivateable, there is no need to evaluate the relationship in the forward direction. When a relationship is notActivateable and has been excluded, there is no need to evaluate in the backward, or reverse, direction.

Unseletion

Figure 11:
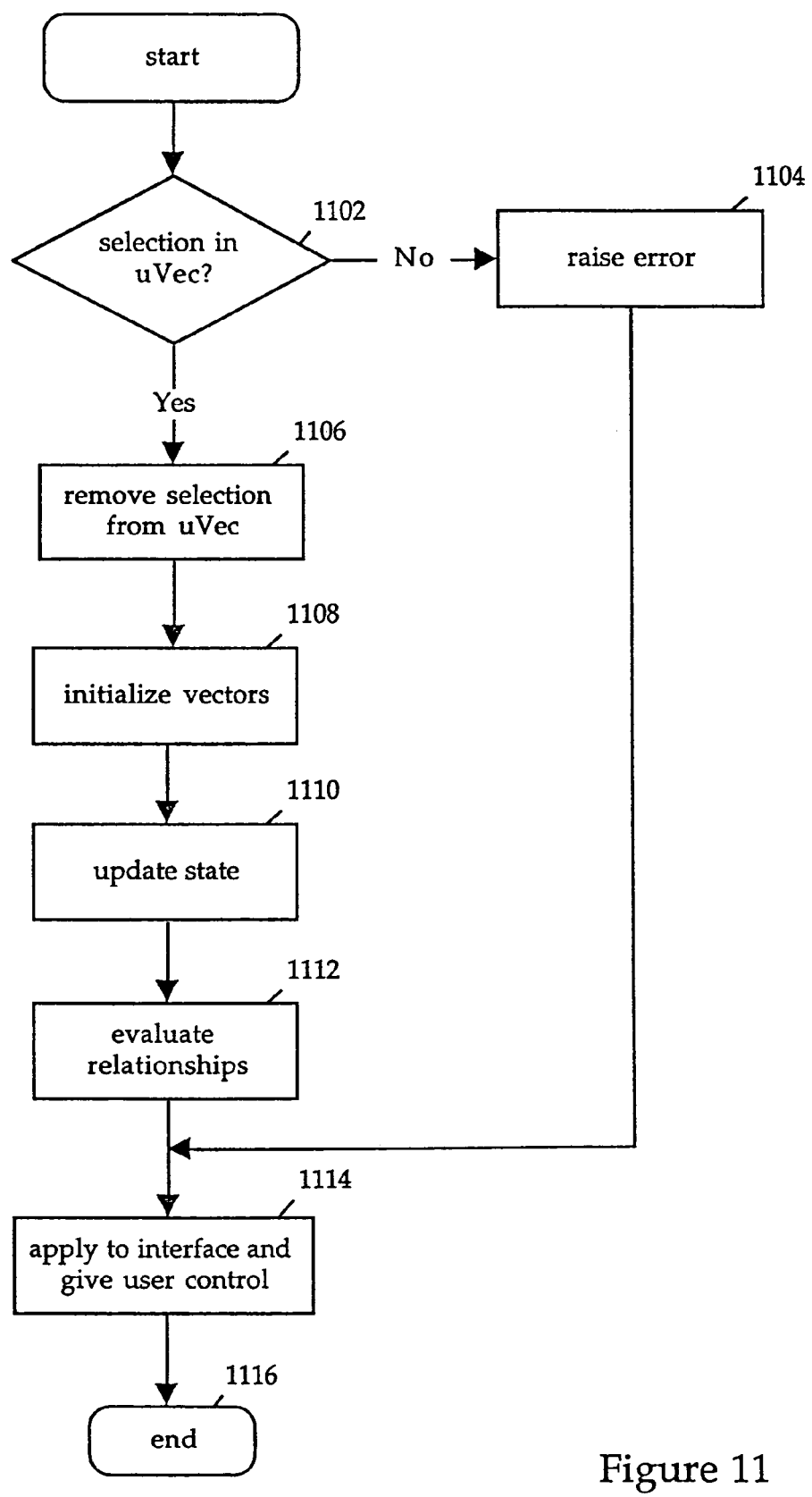
FIG. 11 provides an example of an unselect item process flow according to an embodiment of the invention.

FIG. 9 described processing where the user input was an item selection. Configuration system 212 also processes user input to unselect an item from the configuration. As previously discussed, an item can be unselected in any order. There is no requirement to unselect items the reverse order in which they were selected. FIG. 11 provides an example of an unselect item process flow according to an embodiment of the invention.

At step 1102 (i.e., "selection in uVec?"), a determination is made whether the item that is selected for deletion was selected for inclusion in the configuration by the user. If it is determined that the item is not a user-selected item, processing continues at step 1104 to raise an error. Processing continues at step 1114 to update the GUI (if necessary) and return control to the user. Processing of the current input ends at step 1116.

If it is determined at step 1102 that the item selected for unselection was selected by the user, processing continues at step 1106 to reset the bit in the uVec that corresponds to the unselected item (i.e., set the bit to zero). This unselects the item from the current configuration. At step 1108, the iVec, xVec, and rVec vectors are initialized (set to zero). Steps 1110, 1112 and 1114 correspond to steps 910, 912, and 914, respectively, of FIG. 9. Processing ends at step 1116.

Translation Between Representations

To ensure correct runtime behavior of the engine, a potentially incomplete user-defined set of relationships is converted into a set of complete runtime relationship tables. The external representation is translated into an internal representation. The invention maps the hierarchies contained in parts catalog 204 to relationships and maps relationships to the runtime tables, for example.

Figure 12:
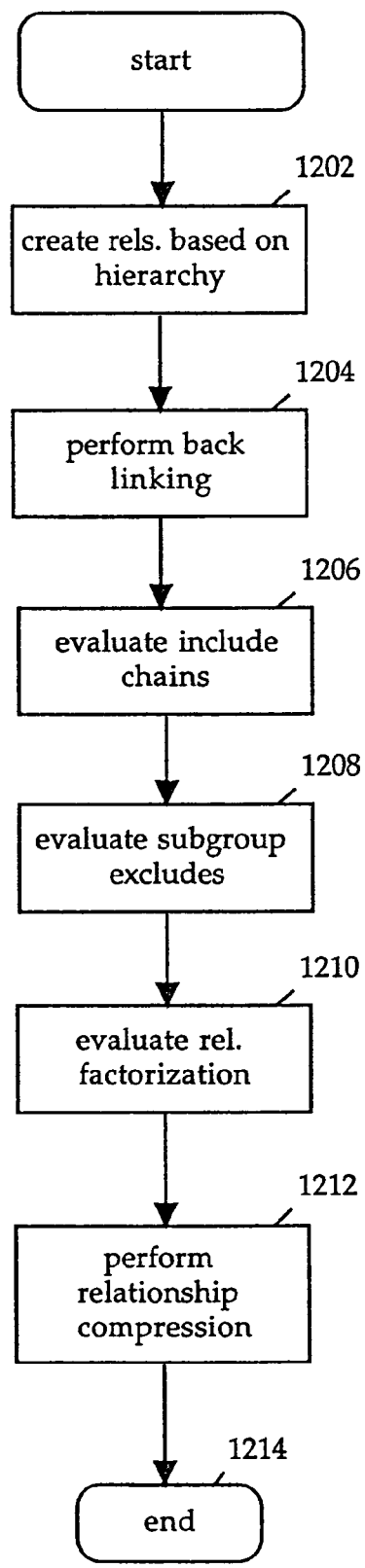
FIG. 12 provides a flow for translation processing according to an embodiment of the invention.

As discussed above, compiler 704 performs a mapping between product-level relationships and part-level relationships. The translation process further provides the ability to translate a multi-level hierarchy to a single-level hierarchy. That is, the translation process can be used to flatten out the intuitive hierarchy created by a maintenance user using the user interface of FIG. 6, for example. FIG. 12 provides a flow for translation processing according to an embodiment of the invention.

At step 1202, a set of relationships is created based on the hierarchies. Thus, for example, group 312 is translated into an requires choice relationship. That is, group 312 requires a choice between parts 306, 308, and 310. Relationships can be defined in terms of groups. An identifier (item ID) is used to identify the group. When a group appears on the left-hand side of a relationship, the group is assigned an item ID and the relationship is defined in terms of the new item ID. This process, referred to as back-linking, is performed at step 1204.

At step 1206, an include chain evaluation is performed. In an include chain evaluation, all include relationship chains are fully evaluated so that a relationship contains all of the parts that are included in that part regardless of whether the included relationship is direct (e.g., mentioned in the includes relationship) or indirect (mentioned in another includes relationship that contains an included part on the right-hand side).

At step 1208, subgroup excludes are evaluated. In this process, active requires choice relationships are evaluated where one relationship's right-hand side is a subset of another relationship's right-hand side. In this case, if both relationships are active, the right-hand side parts that are not within the subset are excluded. Relationship factorization is performed at step 1210. Relationship factorizing can create new relationships that ensure proper runtime behavior when more than one item is selected during some iteration.

Removing redundancy in relations may cause some relations to become unnecessary. A relation becomes unnecessary when it contains no items on its right side. Redundant relationships are removed at step 1212. Processing ends at step 1214.

Back-Linking

Relationships can be defined in terms of groups. When a group appears on the left-hand side of a relationship, the group is assigned an item ID and behaves as a normal item (e.g., part) and the relationship is defined in terms of this new item ID. A relationship is defined for each item in the group:

item includes item ID (of the group)

Figure 13A:
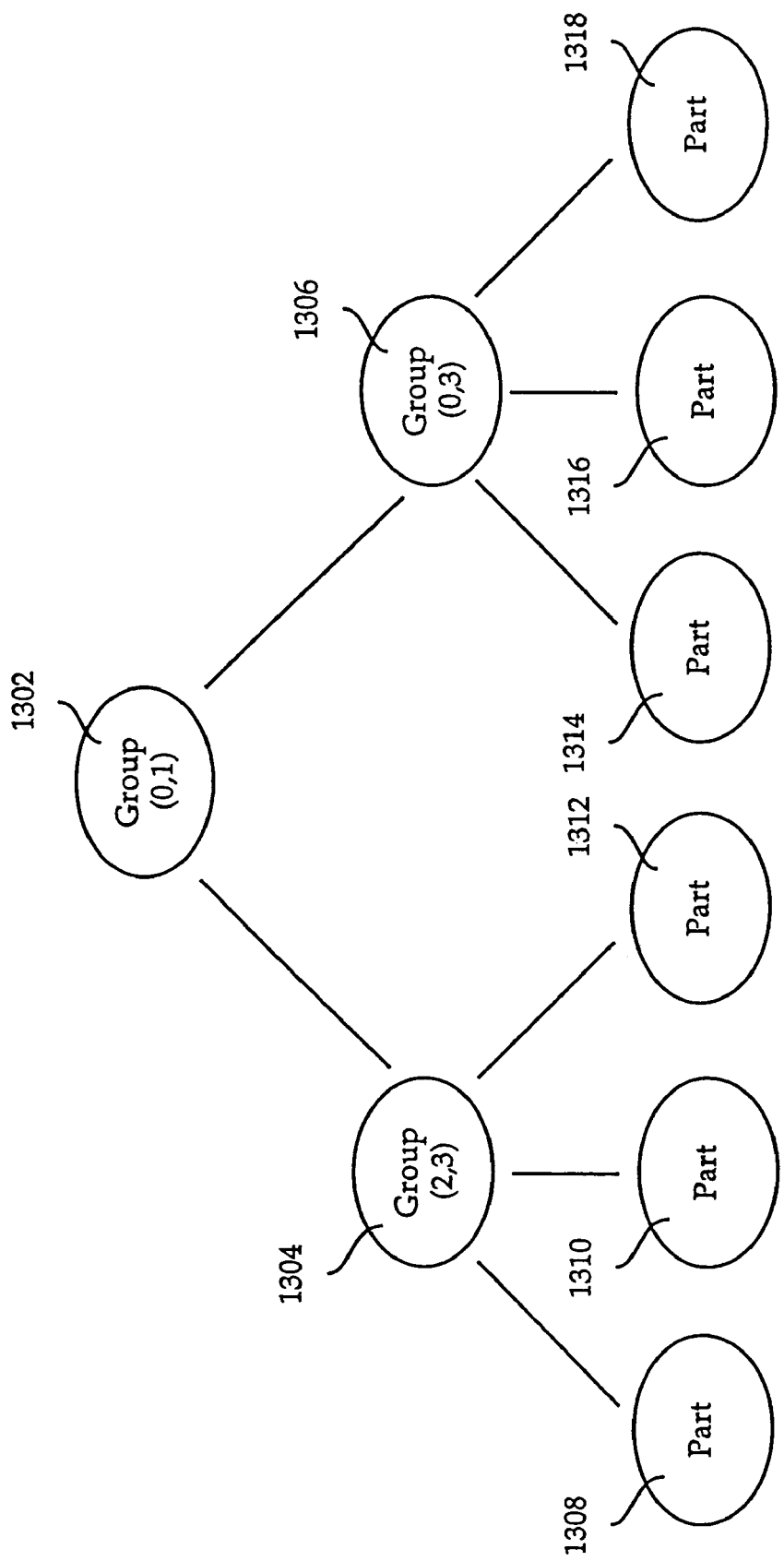
FIGS. 13A-13B provide an illustration of groups and nested groups according to an embodiment of the invention.
Figure 13B:
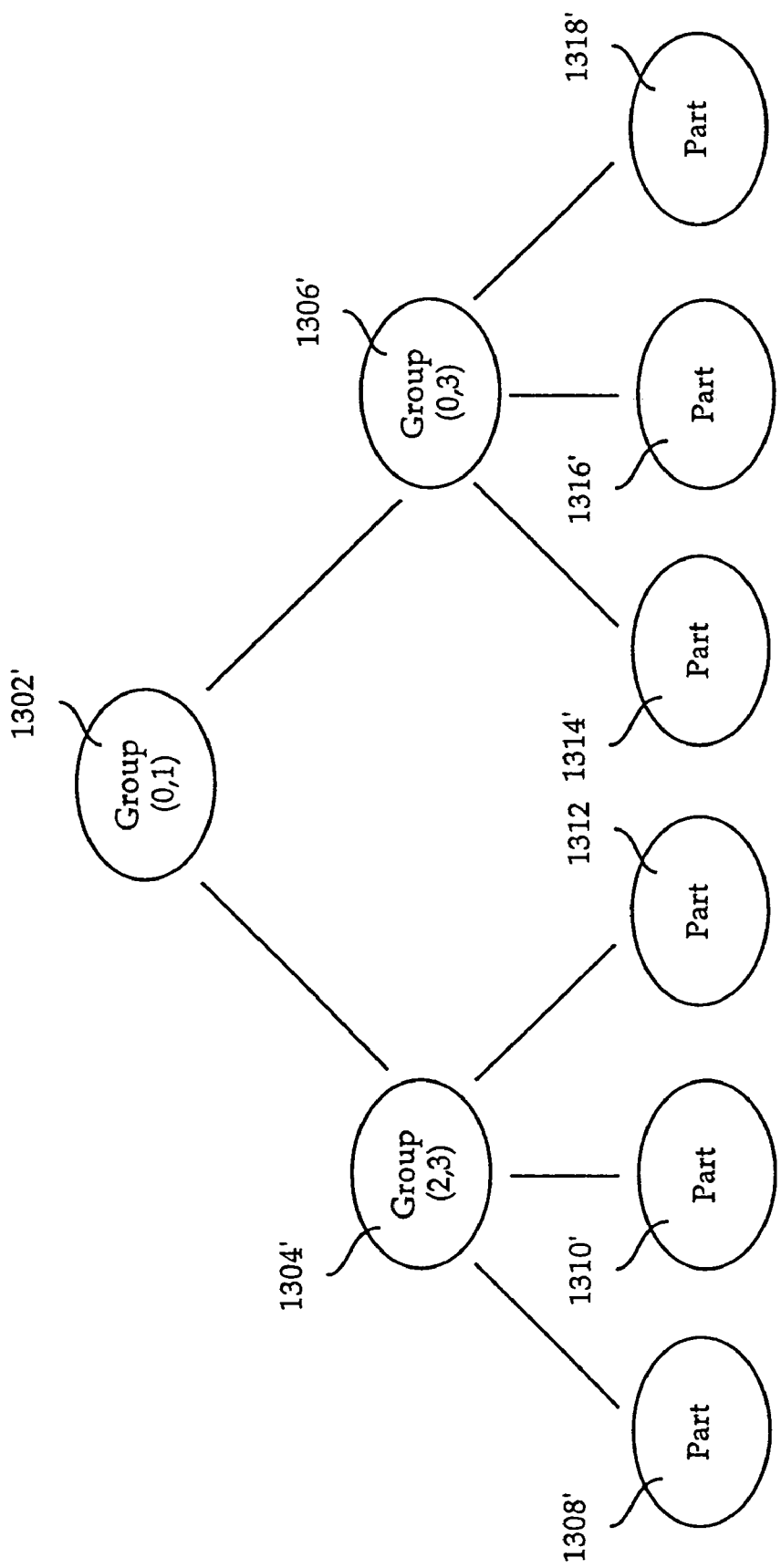

It is only necessary to create this relationship once per group, regardless of how many times that group appears on the left side of a relationship. Back-Linking can be used to generate relationships in nested groups. FIGS. 13A-13B provide an illustration of groups and nested groups according to an embodiment of the invention. Group 1302 contains two items (groups 1304 and 1306) that are nested within group 1302. Notation is provided for a group to specify the minimum and maximum bounds for a group. For example, the notation "(0,1)" indicates that between zero and one items in group 1302 are to be chosen.

The items contained in group 1302 are also groups that contain multiple items. Groups 1304 and 1306 are nested within group 1302. Two or three of parts 1308-1312 can be chosen from Group 1304. Zero to three of parts 1314-1318 can be chosen from Group 1306.

The invention creates a metapart for these groups (groups 1302-1306). Relationships are then created between the groups and their members such that items are back-linked to their parents. FIG. 13B provides an illustration of metaparts for the groups and nested group of FIG. 13A according to an embodiment of the invention. Groups 1302'-1306' are metaparts for groups 1302-1306, respectively. Relationships can be generated using these metaparts as follows:

Group 1302' requires choice [Group 1304', Group 1306'] 0,1

Group 1304' requires choice [part 1308, part 1310, part 1312] 2,3

Group 1306' requires choice [part 1314, part 1316, part 1318] 0,3

The metapart is used internally; it is unnecessary for a user to be aware of them. Using back-linking, relationships can be generated such that an item (e.g., part 1308) links back to its predecessor(s) (e.g., nested group, group 1302). The following new relationships can be created for the examples of FIGS. 13A-13B:

Group 1304' includes Group 1302'
Group 1306' includes Group 1302'
Part 1308 includes Group 1304'
Part 1310 includes Group 1304'
Part 1312 includes Group 1304'
Part 1314 includes Group 1306'
Part 1316 includes Group 1306'
Part 1318 includes Group 1306'

When a user selects part 1308, part 1308 includes group 1304'. Group 1304' is added to the configuration. Further, group 1304' includes group 1302' thereby including group 1302'. When group 1302' is included in the configuration, it activates the relationship that requires a choice between groups 1304' and 1306'. Since group 1304' is already selected, group 1306' can be excluded. When group 1306' is excluded, parts 1314-1318 are excluded when the newly generated relationships are evaluated in the reverse (backward) direction. Further, the bounds specified by group 1304 are also enforced using these relationships.

As discussed above, a requires choice relationship can be defined at the product level. A product can require a choice between items in a group. The product-level requires choice relationship is treated similarly to that of a requires choice part-level relationship.

Include Chains

In an include chain evaluation, all include relationship chains are fully evaluated so that a relationship can be generated that contains all of the parts that are included regardless of whether the relationship is direct (e.g., the included parts mentioned in the includes relationship) or indirect (a part is mentioned in another includes relationship that contain an included part on the right-hand side). For example, the following relationships exists in the external representation:

a includes b and c
b includes d
d and c includes e

An include chain exists that starts with a. The first relationship indicates that a includes b and c. Based on the second and third relationships, b and c include other parts. Based on all of the relationships, a includes b, c, d, and e. Include chain evaluation expands these relationships into the following relationships:

a includes b and c and d and e
b includes d
d and c includes e

Figure 14A:
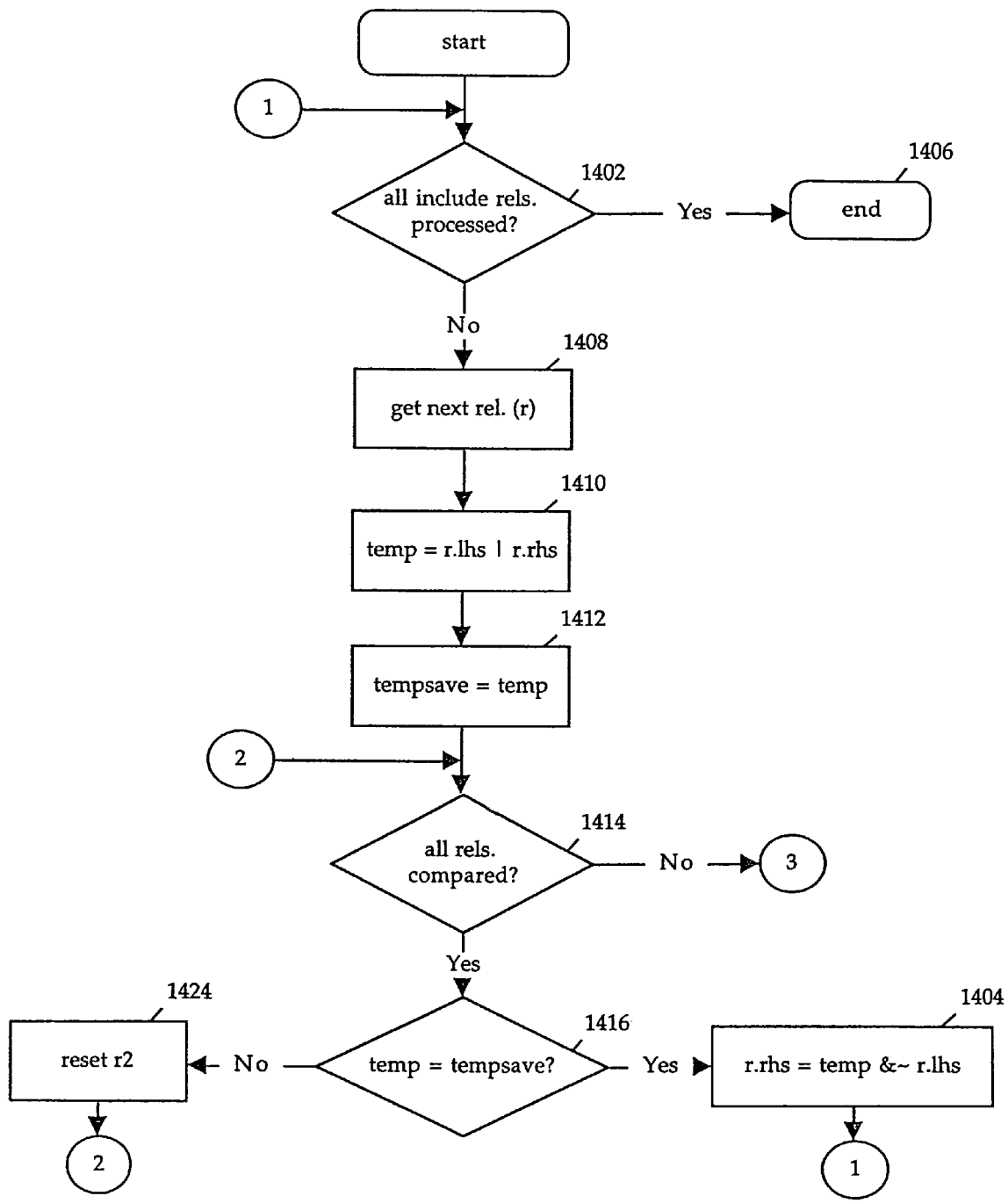
FIGS. 14A-14B provide an includes chain process flow according to an embodiment of the invention.
Figure 14B:
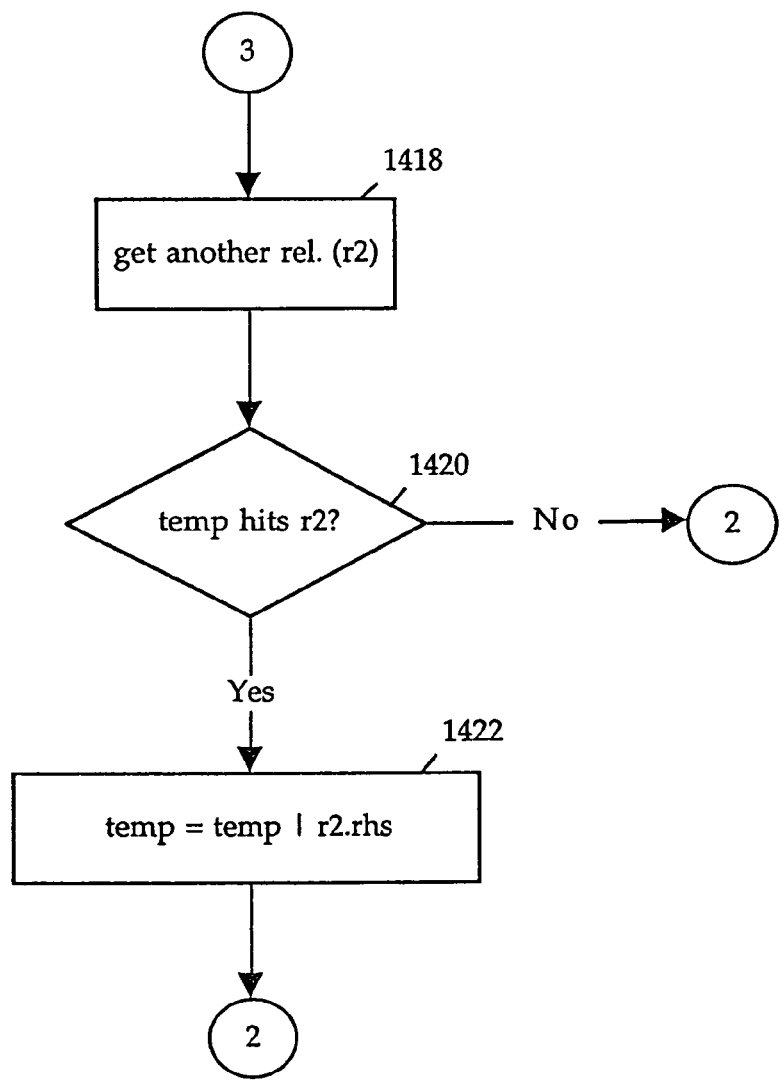

It is not necessary to generate additional relationships to perform includes chain evaluation. Preferably, includes chain evaluation can modify an existing relationship to include both direct and indirect includes relationships. Each includes relationship can be evaluated against all other includes relationships to determine whether its right-hand side should be modified to include both direct and indirect includes relationships. Once all of the includes relationships have been evaluated, a new right-hand side value can be generated based on the evaluation. FIGS. 14A-14B provide an includes chain process flow according to an embodiment of the invention.

At step 1402 (i.e., "all include rels. processed?"), a determination is made whether all of the includes relationships have been processed. If other includes relationships remain to be processed, processing continues at step 1408 to get the next includes relationship, r. At step 1410, a temporary vector, temp, is created that is the result of an "or" operation between the left-hand and right-hand sides of r. Another temporary vector, tempsave, is created that is set to the value of temp at step 1412. At step 1414 (i.e., "all rels. compared?"), a determination is made whether all of the other includes relationships have been evaluated against r. If not, processing continues at step 1418 to get another relationship, $r_2$. At step 1420 (i.e., "temp hits $r_2$?"), a determination is made whether any of the items contained in temp are also contained in $r_2$. If not, processing continues at step 1414 to process any remaining relationships against r. If so, processing continues at step 1422 to perform a "or" operation between temp and the right-hand side of $r_2$ to add the right-hand side of $r_2$ to the temp vector.

If it is determined, at step 1414, that all of the relationships $r_2$ have been evaluated for r, processing continues at step 1416. At step 1416 (i.e., "temp=tempsave?"), a determination is made whether any items were added to the temp vector. If not, there are no indirect includes and processing continues at step 1424 to reset $r_2$ and processing continues at step 1414 to process any remaining relationships against this relationship. If so, processing continues at step 1404 to modify the right-hand side of r to include the items contained in the temp vector minus the items contained in the left-hand side of r. Processing continues at step 1402 to process any remaining relationships.

If it is determined at step 1402 (i.e., all include rels. processed?") that all of the includes relationships have been evaluated for include chains, processing ends at step 1404.

Subgroup Excludes

The subgroup excludes evaluation is performed on requires choice relationships. Assume a requires choice relationship points to a group (A) that is a complete subgroup of a group (B) of another requires choice relationship. If B has a max of 1 and both relationships are made active, the items in B that are not in A, Q, cannot be chosen. If a pairwise comparison of requires choice relationships yields such cases, a relationship such as the following is generated:

[union of left sides of both relationships] can't work with Q

For example, assume that the following relationships have been defined:

a b requires choice [x, y, z] (0,1)
d requires choice [x, y] (0,2)

The second relationship contains a group that is a subgroup of the first relationship. When both relationships are active, the non-subset is excluded. This avoids the case where a user selects a, b, and d and the relationship evaluations do not exclude the items not included in both groups (the non-subset). The invention combines these relationships and creates an excludes relationship. The excludes relationship for the above example is as follows:

a b d excludes z

Figure 15A:
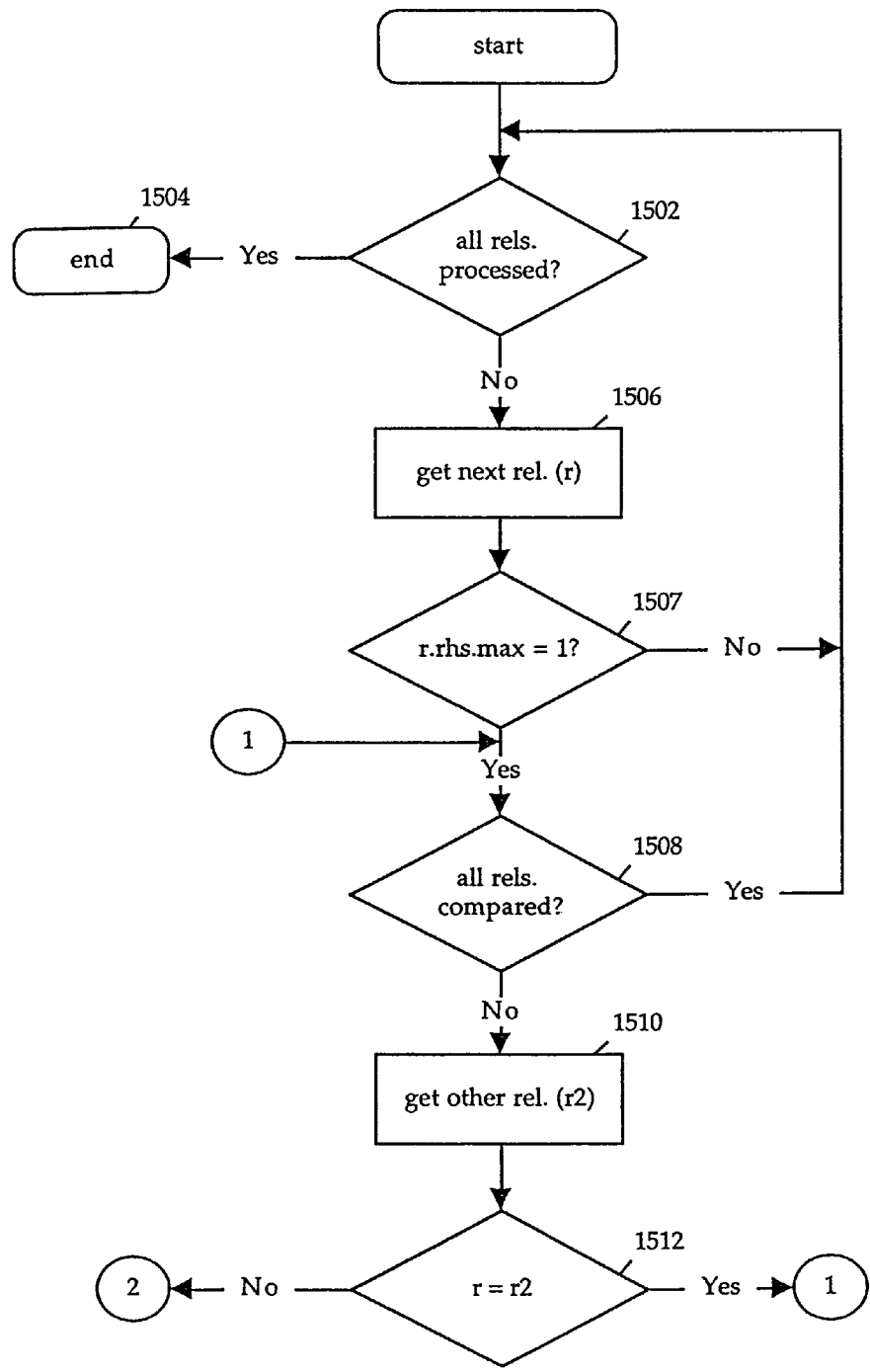
FIGS. 15A-15B provides an example of a subgroup excludes process flow according to an embodiment of the invention.
Figure 15B:
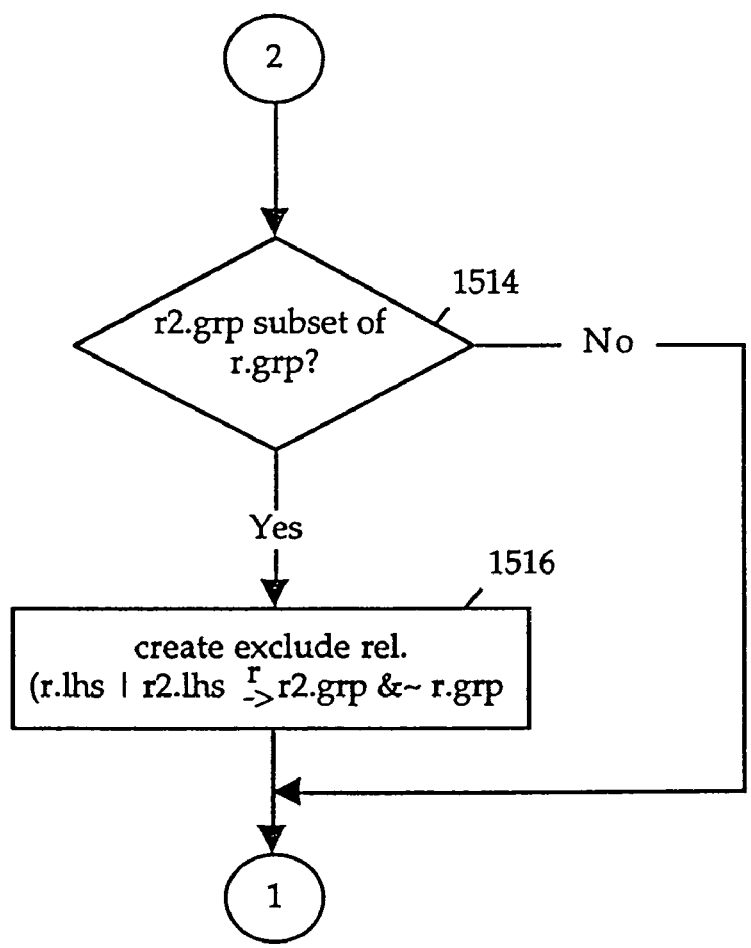

FIGS. 15A-15B provides an example of a subgroup excludes process flow according to an embodiment of the invention. At step 1502 (i.e., "all rels. processed?"), a determination is made whether all of the requires choice relationships have been processed. If so, processing ends at step 1504. If not, processing continues at step 1506 to get the next relationship, r. At step 1507 (i.e., "r.rhs.max=1?"), a determination is made whether the maximum value for the relationship is equal to one. If not, processing continues at step 1502 to process any remaining relationships. If so, processing continues at step 1508. At step 1508 (i.e., "all rels. compared?"), a determination is made whether all of the other requires choice relationships have been processed against r. If so, processing continues at step 1502 to process another requires choice relationship.

If not, processing continues at step 1510 to get another relationship, $r_2$. At step 1512 (i.e., "r=$r_2$?"), a determination is made whether the two relationships are equal. If so, processing continues at step 1508 to process any remaining requires choice relationships against the current r. If r and $r_2$ are not equal, processing continues at 1514. At step 1514 (i.e., "r2.grp subset of r.grp?"), a determination is made whether the right-hand side of $r_2$ is a subset of the right-hand side of r. If not, processing continues at step 1508 to process any remaining requires choice relationships against the current r. If so, processing continues at step 1516 to create an exclude relationship where the left-hand side is the union of the left-hand side of r and $r_2$ and the right-hand side is the non-subset of the right-hand side of the two relationships. Processing continues at step 1508 to process any remaining requires choice relationships against the current r.

Relationship Factorization

The invention assumes that one item on the left side of a relationship is preferably selected during any iteration. However, the includes and requires choice relationships may cause additional items to become selected (e.g., selected by the system). Factorizing of relationships can create new relationships to ensure proper runtime behavior when more than one item is selected during some iteration.

Factorization causes a relationship to be created where a relationship has items on the left-hand side that also appear on the right-hand side of an includes relationship. The new relationship represents the common factorization of both relationships. For example, where the following two relationships exist:

[a] includes [b and c]
[b and c and d and e] can't work with [x and y]

the following relationship is created:

[a and d and e] can't work with [x and y]

The invention uses a technique in factorization that avoids combinatorial explosion. Relationships are created during factorization when they add value. The invention identifies value where the new relationship:

1. replaces more than one item from the left-hand side;
2. has at least two-different includes relationships replace at least one unique item from the left-hand side of the relationship being factorized; and
3. the two includes relationships have at least one common item in their left-hand side.

Figure 16A:
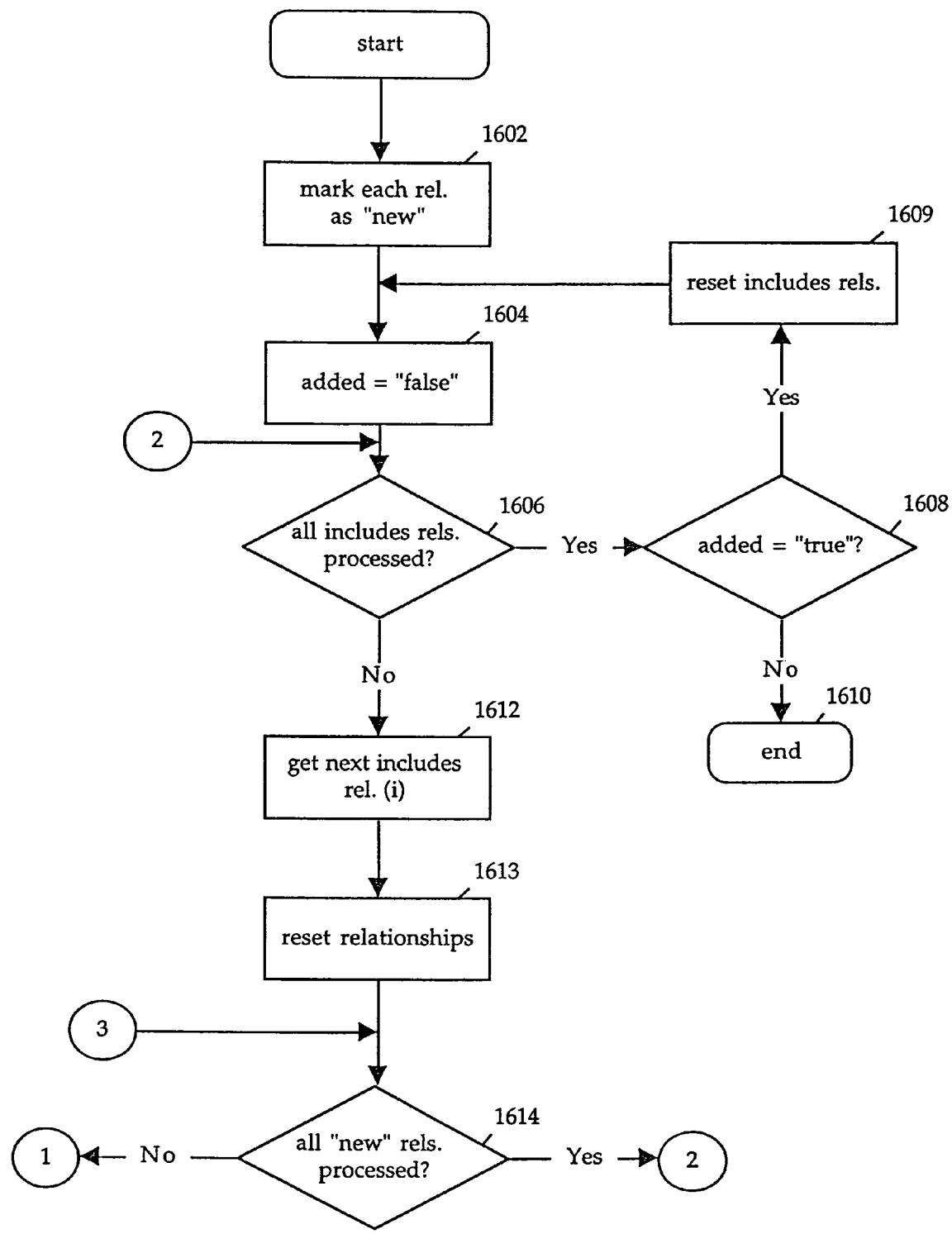
FIGS. 16A-16C provide an example of a relationship factorization process flow according to an embodiment of the invention.
Figure 16B:
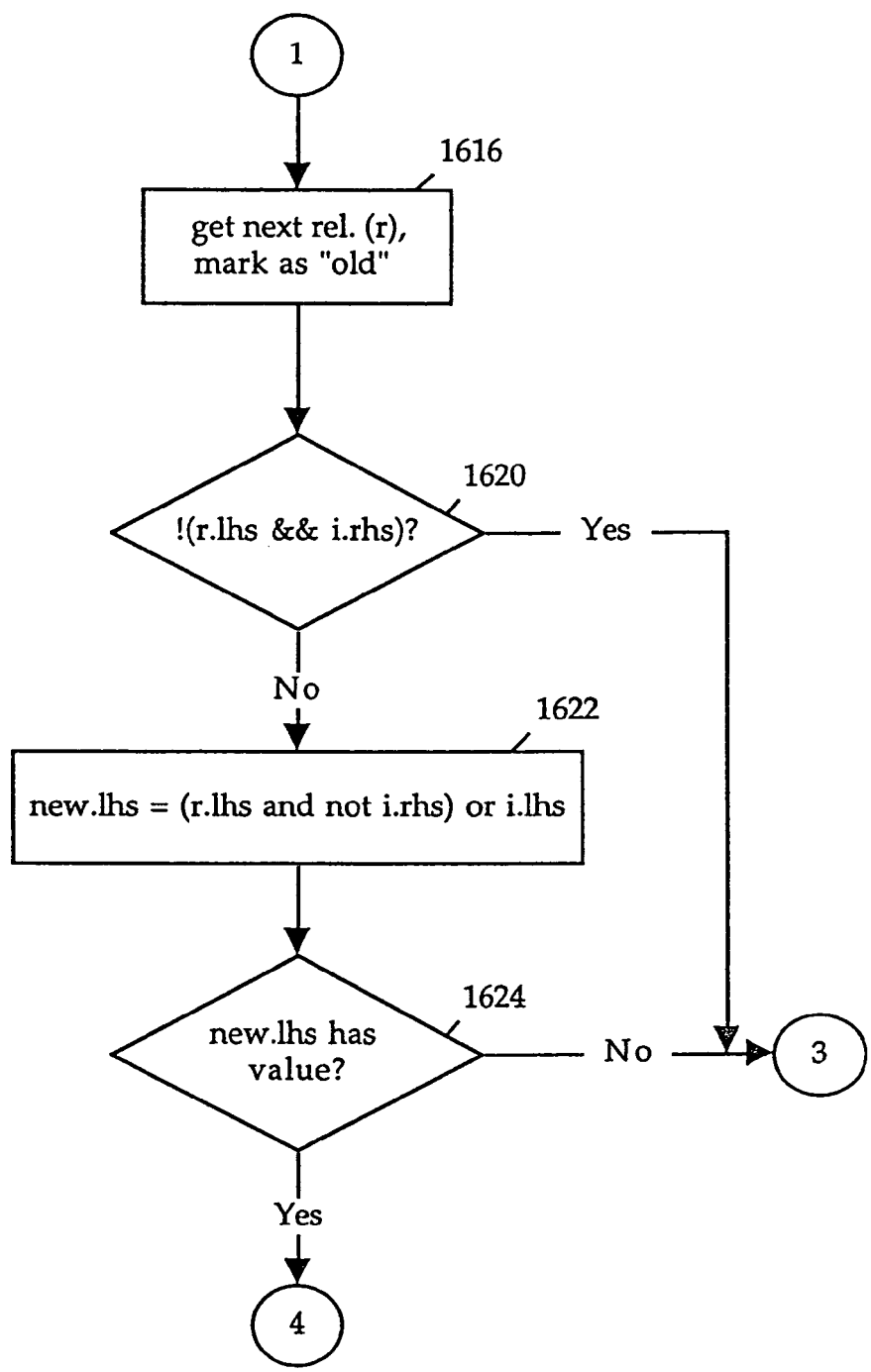
Figure 16C:
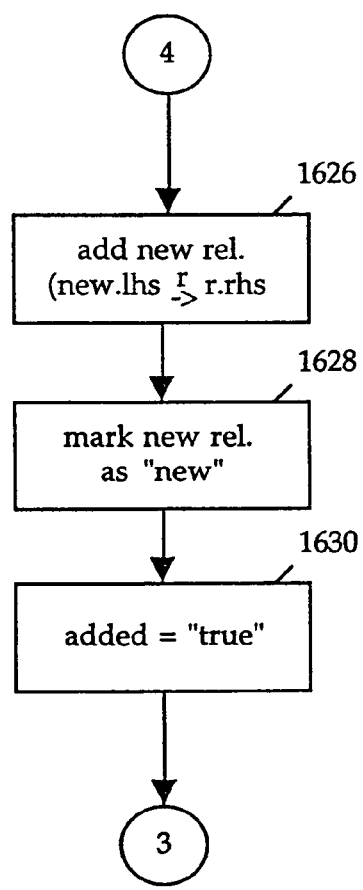

FIGS. 16A-16C provide an example of a relationship factorization process flow according to an embodiment of the invention. At step 1602, each relationship is marked as "new". At step 1604, a state variable, added, is initialized to "false". At step 1606 (i.e., "all includes rels. processed?"), a determination is made whether all of the includes relationships have been processed. If so, processing continues at step 1608 (i.e., "added='true'?) to determine whether any new relationships were added. If not, processing ends at step 1610. If there are new relationships, processing continues at step 1609 to reset the includes relationships and processing continues at step 1604 to initialize added to "false".

If it is determined at step 1606 that all of the includes relationships have not been processed, processing continues at step 1612 to get the next includes relationship, i. At step 1613, the relationships are reset. At step 1614 (i.e., "all 'new' rels. processed?"), a determination is made whether all of the relationships have been marked as "new" have been processed against i. If so, processing continues at step 1606 to process any remaining includes relationships. If not, processing continues at step 1616.

At step 1616, the next relationship, r, is marked as "old". At step 1620 (i.e., "!(r.lhs && i.rhs)?", a determination is made whether the right-hand side of the i relationship and the left-hand side of the r relationship have any bits in common. If they do not have bits in common, processing continues at step 1614 to process any remaining relationships against the current i. If they do have bits in common, processing continues at step 1622 to generate new.lhs from the includes relationship and the left-hand side of r. Step 1622 takes out items in the right-hand side of i from left-hand side of r and adds in items that are in the left-hand side of i. At step 1624 (i.e., "new.lhs has value?") a determination is made whether new.lhs has value. This determination can use the guidelines as specified above.

If new.lhs does not have value, processing continues at step 1614 to processing any remaining relationships against i. If it does have value, processing continues at step 1626 to add a new relationship (of the type r) that uses new.lhs as the left-hand side and the right-hand side of r. The new relationship is marked as "new" at step 1628. The value of added is set to "true" at step 1630. Processing continues at step 1614 to process any remaining relationships.

Relationship Compression

Removing redundancy in relations may cause some relations to become unnecessary. A relation becomes unnecessary when it contains no items on its right side. If a relationship's left-hand side is a proper subset of the left-hand side of another relationship, then the first relationship is guaranteed to be active whenever the second relationship is active. If both relationships are also the same type of relationship, the common right-hand. side elements can be removed from the second relationship. This can be repeated to remove all unnecessary relationships. The following relationships provide an example:

[a] removes [c]

[a and b] removes [c and d]

The left-hand side of the first relationship is a proper subset of the left-hand side of the second relationship (e.g., all elements "a" in the left-hand side of the first relationship are contained in the left-hand side of the second relationship). The relationships are the same type. Therefore, the common right-hand side elements can be removed from the right-hand side of the second relationship. The following is the result after modifying the relationship:

[a] removes [c]

[a and b] removes [d]

Figure 17A:
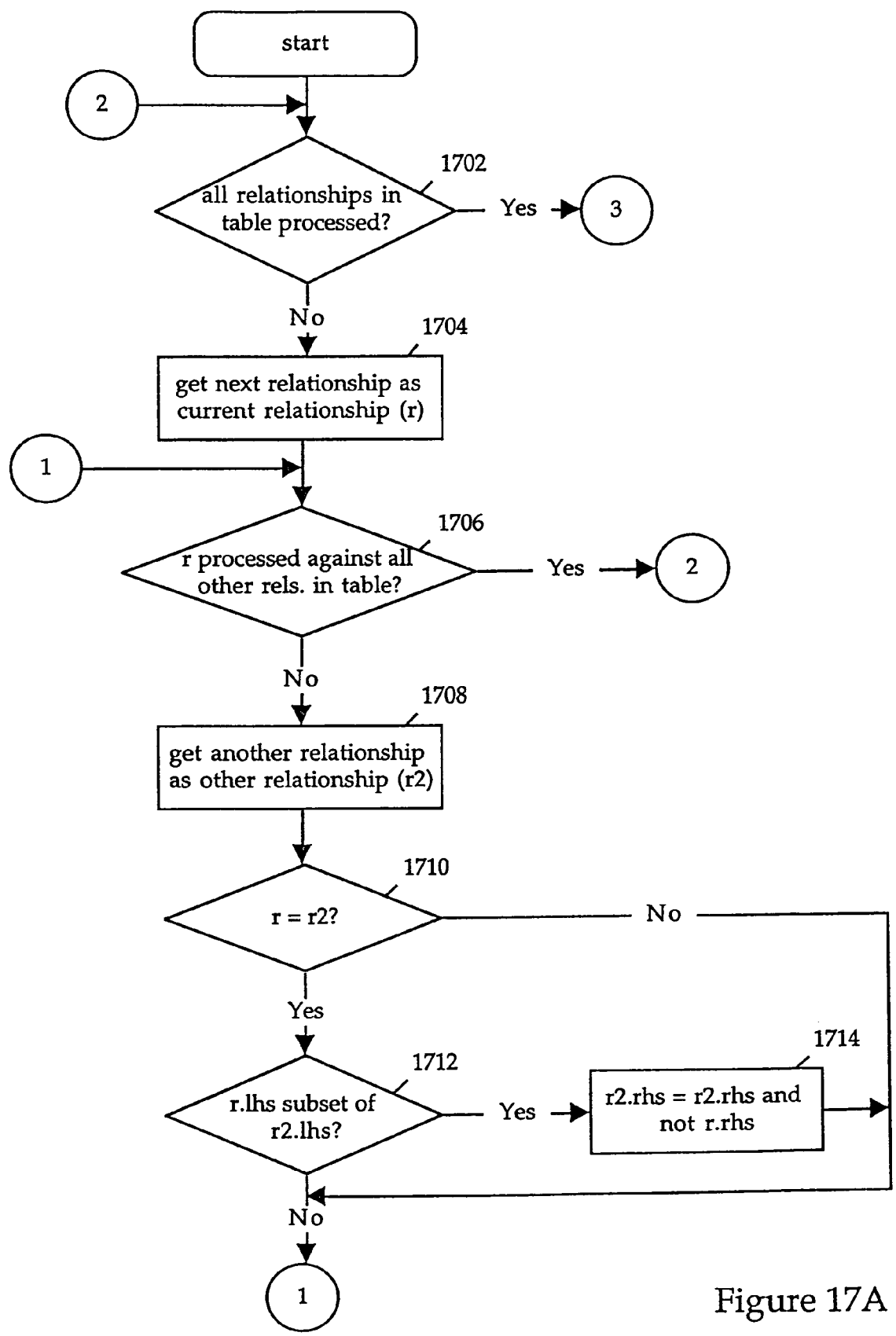
FIGS. 17A-17B provide an illustration of a relationship compression process flow according to an embodiment of the invention.
Figure 17B:
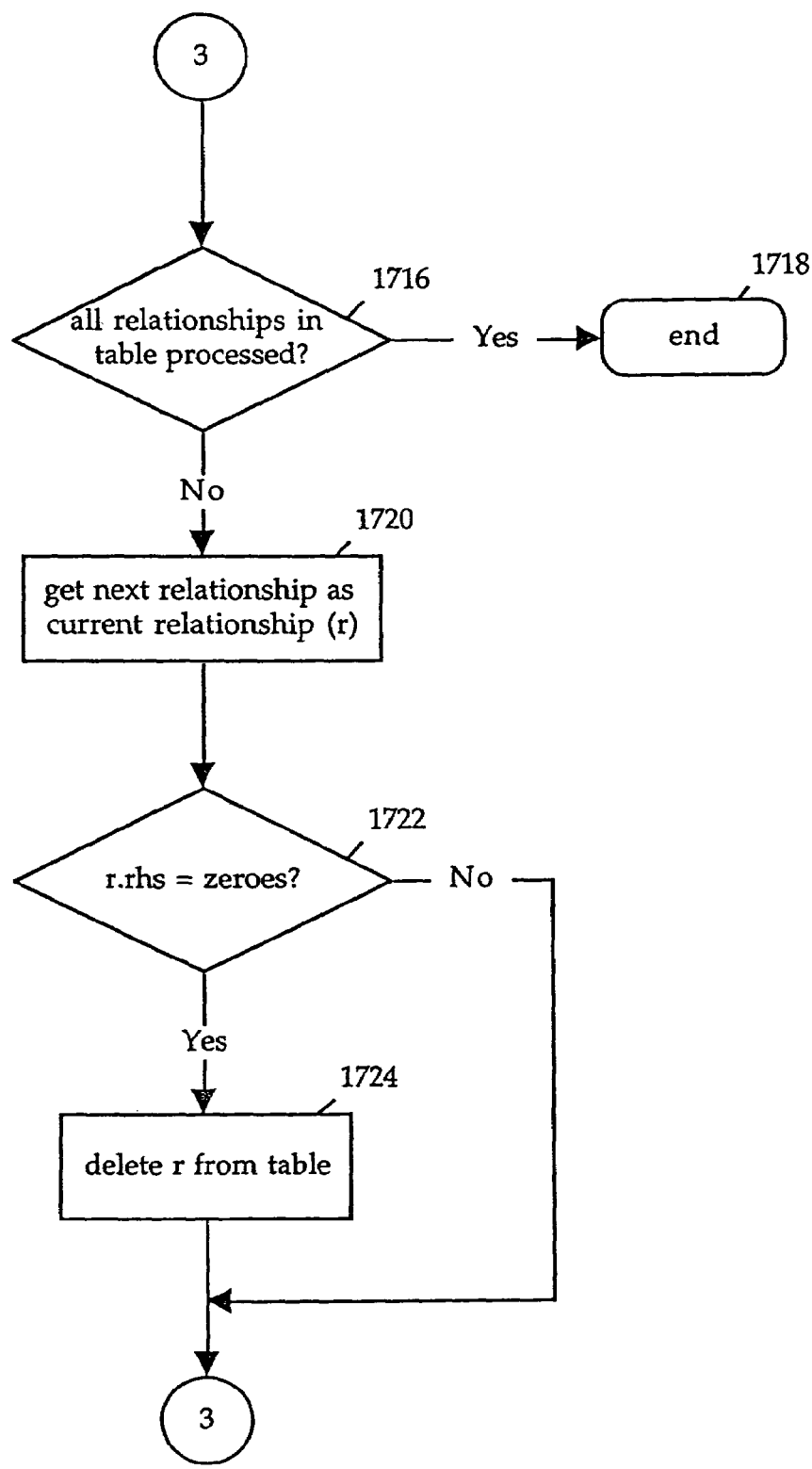

FIGS. 17A-17B provide an illustration of a relationship compression process flow according to an embodiment of the invention. At step 1702 (i.e., "all relationships in table processed?"), a determination is made whether all of the relationships in the table have been processed. If not, processing continues at step 1704 to get the next relationship, r. At step 1706 (i.e., "r processed against all other rels. in table?"), a determination is made whether the other relationships in the table have been processed against r. If so, processing continues at step 1702 to process any remaining relationships in the table as r.

If it is determined at step 1706 that all of the other relationships have not been processed against r, processing continues at step 1708. Another relationship is retrieved as $r_2$ at step 1708. At step 1710 (i.e., "r=$r_2$?"), a determination is made whether the relationships are the same. If not, processing continues at step 1706 to process any remaining relationships against r. If so, processing continues at step 1712. At step 1712 (i.e., "r.lhs subset of r2.lhs?"), a determination is made whether the left-hand side of r is a subset of the left-hand side of $r_2$. If the subset condition is true, processing continues at step 1714 to remove the common items out of the right-hand side of r (i.e., perform the operation $r_2$.rhs=$r_2$.rhs and not r.rhs). Processing continues at step 1706 to process any remaining relationships against r.

If it is determined at step 1702 that all of the relationships have been processed as r, processing continues at step 1716. At step 1716 (i.e., "all relationships in table processed?") a determination is made whether all of the relationships have been processed. If so, processing ends at step 1718. If not, processing continues at step 1720 to get another relationship as r. At step 1722 (i.e., "r.rhs=zeroes?"), a determination is made whether the right-hand side of r has been set to zero has a result of compression. If not, processing continues at step 1716 to process any remaining relationships. If so, processing continues at step 1724 to delete r from the table. Processing continues at step 1716 to process any remaining relationships.

Global Relationships

Global relationships can be defined that are processed for all products. Thus, it is unnecessary to redefining a relationship for all of the products. The relationship can be defined as a global relationship that is applied for every product. If, however, partitioned relationship tables are used for each product, it is necessary to evaluate the relationships in a product's partitioned relationship tables as well as the global relationships. For example, the process flows described herein that operate on relationship tables can be performed once for the product's partitioned relationship tables and once for the global relationships.

Thus, a method and apparatus for maintaining and configuring systems has been provided.

The invention claimed is:

1. A method of using a graphical user interface of a computer system to interactively generate a product definition for use in configuring a product, the method comprising:
   performing with the computer system:
      graphically displaying a parts catalog;
   using the computer system for:
      (a) selecting an element from the parts catalog, wherein the element comprises one or more parts;
      (b) graphically associating the selected element to create a product-to-element classification relationship;
   repeating (a) and (b) to complete the product definition; and
   using the computer system for:
      (c) selecting a first element from the parts catalog;
      (d) selecting a second element from the parts catalog; and
      (e) graphically associating the first and second elements selected in (c) and (d) to associate the first and second elements with one or more element-to-element relationships.

2. The method of claim 1 wherein graphically associating in (b) comprises manipulating the selected element to associate the selected element with a product-to-element classification relationship and graphically associating in (e) comprises manipulating the first and second elements selected in (c) and (d) to associate the first and second elements with one or more element-to-element relationships.

3. The method of claim 2 wherein the manipulating in (b) and (e) comprises:
   dragging a cursor to a section of a computer window that indicates a particular classification relationship.

4. The method of claim 2 wherein the one or more element-to-product classification relationships include 'requires choice'.

5. The method of claim 2 wherein the one or more element-to-product classification relationships comprises at least one member of the group comprising 'includes', 'requires choice', or 'optional'.

6. The method of claim 2 wherein the one or more element-to-element classification relationships comprise a left hand side of a relationship and a right hand side of a relationship.

7. An article of manufacture having instructions encoded therein and executable by a processor to allow a user to interactively generate a product definition using a graphical user interface, the instructions comprising code to cause the processor to:
   graphically displaying a parts catalog;
   (a) selecting an element from the parts catalog, wherein the element comprises one or more parts;
   (b) graphically associating the selected element to create a product-to-element classification relationship;
   repeating (a) and (b) to complete the product definition;
   (c) selecting a first element from the parts catalog;
   (d) selecting a second element from the parts catalog; and
   (e) graphically associating the first and second elements selected in (c) and (d) to associate the first and second elements with one or more element-to-element relationships.

8. A method of using a data processing system to define a system that is configured comprising: (a) selecting an element of the system from a graphically displayed set of elements retrieved from a memory and defining a system-to-element relationship by: (b) graphically indicating that the selected element is included in a definition of the system if the element is necessarily included in the system;
   (c) graphically indicating that the selected element is optional in the definition of the system if the element is an optional element in the system; (d) graphically indicating that the selected element is a required choice if the element is a group that includes more than one members from which to chose; and repeating (a) through (d) for one or more additional elements.

9. The method of claim 8 further comprising:
   (e) selecting first and second elements of the system from the graphically displayed set of elements retrieved from the memory and defining an element-to-element relationship by:
      (f) graphically indicating that the first element is included in a definition of the system if the second element is included in the system;
      (g) graphically indicating that the first element is excluded in the definition of the system if the second element is included in the system;
      (h) graphically indicating that the first element is a required choice if the first element is a group that includes more than one members from which to chose and the second element is included in the system; and
   repeating (e) through (h) for one or more additional elements.

10. The method of claim 9 further defining the element-to-element relationship by:
   (i) graphically indicating that the first element is removed in the definition of the system if the second element is included in the system; and
   repeating (i) for one or more additional elements.

11. A data processing system for configuring a system, the data processing system comprising:
   a processor;
   a memory coupled to the processor and having instructions encoded therein to cause the processor to:
      provide graphically displayed components of a system to a user, wherein the graphically displayed components are displayed in accordance with a definition of the system that comprises a set of component relationships, the set of component relationships identifying classifications for the plurality of graphically displayed components;
      obtain user input, said user input identifying at least one selected component from said plurality of graphically displayed components; and analyze the at least one selected component and component relationships that include the one selected component to determine if any of the graphically displayed components should be excluded from the configured system.

12. A method for configuring a system comprising:

providing graphically displayed components of a system to a user, wherein the graphically displayed components are displayed in accordance with a definition of the system that comprises a set of component relationships, the set of component relationships identifying classifications for the plurality of graphically displayed components;

obtaining user input, said user input identifying at least one selected component from said plurality of graphically displayed components; and analyzing the at least one selected component and component relationships that include the one selected component;

after analyzing the at least one selected component and component relationships that include the one selected component, providing only graphically displayed components of a system that can be selected consistent with the definition of the system.

13. A method for configuring a product using an electronic system, wherein a definition of the product comprises a set of element-to-element relationships identifying classifications for interrelating each element with at least one other element, the method comprising:

obtaining user input, the user input identifying at least one selected element from a plurality of displayed elements to be included in a product configuration; and executing code stored in the electronic system to analyze the at least one selected element and maintain a valid product configuration by determining if activating a set of element-to-element relationships associated with the at least one selected element causes other elements to either be included in the product configuration, excluded from future selection by a user as long as the at least one selected element is included in the product configuration, or requires the user to choose between a plurality of elements for inclusion in the product configuration.

\* \* \* \* \*